United States Patent
Sako

(10) Patent No.: US 6,980,498 B2
(45) Date of Patent: Dec. 27, 2005

(54) METHOD OF RECORDING ON RECORDING MEDIUM AND RECORDING DEVICE, AND METHOD OF REPRODUCING FROM RECORDING MEDIUM AND REPRODUCING DEVICE

(75) Inventor: Yoichiro Sako, Tokyo (JP)

(73) Assignee: Sony Corporation, Tokyo (JP)

( * ) Notice: Subject to any disclaimer, the term of this patent is extended or adjusted under 35 U.S.C. 154(b) by 349 days.

(21) Appl. No.: 10/311,777

(22) PCT Filed: Apr. 24, 2002

(86) PCT No.: PCT/JP02/04073

§ 371 (c)(1),
(2), (4) Date: Dec. 18, 2002

(87) PCT Pub. No.: WO02/089136

PCT Pub. Date: Jul. 11, 2002

(65) Prior Publication Data

US 2004/0139380 A1  Jul. 15, 2004

(51) Int. Cl.$^7$ .............................................. G11B 7/00
(52) U.S. Cl. ................................ 369/47.24; 369/53.21
(58) Field of Search ........................... 369/53.1, 53.21, 369/53.22, 47.24, 47.28

(56) References Cited

U.S. PATENT DOCUMENTS

| | | | |
|---|---|---|---|
| 6,519,217 B1 * | 2/2003 | Kawashima et al. | 369/53.2 |
| 6,580,684 B2 * | 6/2003 | Miyake et al. | 369/275.3 |
| 6,614,846 B1 * | 9/2003 | Fujiwara et al. | 375/240.16 |

* cited by examiner

Primary Examiner—Nabil Hindi
(74) Attorney, Agent, or Firm—Jay H. Maioli

(57) ABSTRACT

A method of recording in which supplied data is recorded by performing an encrypting process to at least a part of the supplied data, an encoding process is executed by using a first error correction code, in the case where the supplied data is recorded without performing the encrypting process, an encoding process is executed by using a second error correction code, and the encoded data is recorded onto a recording medium.

18 Claims, 13 Drawing Sheets

TO MODULATING PROCESS

METHOD OF RECORDING ON RECORDING MEDIUM AND RECORDING DEVICE, AND METHOD OF REPRODUCING FROM RECORDING MEDIUM AND REPRODUCING DEVICE

TECHNICAL FIELD

The invention relates to a recording method and a recording apparatus of a recording medium and a reproducing method and a reproducing apparatus of the recording medium which are applied to, for example, a disk-shaped recording medium.

BACKGROUND ART

A method whereby audio data recorded on a compact disc (CD) is compressed by an MP3 (MPEG1 Audio Layer-3) system and the compression data is transmitted and received via a network is widely used. Thus, a process to secure contents (specifically speaking, encryption of the contents) is necessary from a viewpoint of protection of a copyright of music contents. Such compression of the audio data or the process to secure the music contents is usually executed on the basis of an error correcting method in a similar format to the existing format.

In the case where the contents has a linear PCM signal format, usually, errors which could not be corrected by an added error correction code are processed so as to be inconspicuous on a reproduction signal by an interpolating process such as mean Value interpolation or the like. However, in a compression encoding process, for example, a DCT (Discrete Cosine Transform) process is executed on a block unit basis. There are problems such that in the case where data obtained after the DCT process has errors, it is difficult to interpolate the erroneous data by an interpolating technique similar to that in the case of the linear PCM signal, and when the compressed data is decompressed and converted into an audible sound, an influence of the errors is likely to be offensive to the ear.

In the case of contents with a high added value which is charged for when contents data is downloaded via the network or is charged for when the contents data is read out from a medium and reproduced, sufficient reliability is not obtained by error correcting ability equivalent to that of the existing error correction code. For example, in the case where the data obtained by compressing contents data with a high added value by the MP3 system is recorded onto a disk as a recording medium on the basis of a format (that is, mode 1 or mode 2 (form 1)) with an error correcting function of a CD-ROM, although correcting ability for random errors is improved more than in the case of error correcting ability of a CD-DA (Digital Audio) format, correcting ability for burst errors which are caused due to a scratch on the disc, dust on the disc, or the like is not improved more than in the case of the CD-DA format. This means that the reliability of contents which is charged for or contents whose copy limitation is severe is equivalent to that of contents which are free or in which copy restriction is mild or there is no copy limitation, so that the user is unsatisfied.

It is, therefore, an object of the invention to provide a recording method and a recording apparatus of a recording medium and a reproducing method and a reproducing apparatus of the recording medium, in which error correcting encoding can be switched in accordance with data to be recorded.

DISCLOSURE OF INVENTION

To solve the above problems, according to the invention, there is provided a recording method of a recording medium, comprising the steps of: executing an encoding process by using a first error correction code in the case of recording supplied data by performing an encrypting process to at least a part of the supplied data; executing an encoding process by using a second error correction code in the case of recording the supplied data without performing the encrypting process to the supplied data; and recording the encoded data onto the recording medium.

According to the invention, there is provided a recording method of a recording medium, comprising the steps of: discriminating whether supplied data is data in which at least a part of the data has been encrypted or not; executing an encoding process by a first error correction code when the supplied data is the encrypted data; discriminating whether at least a part of the supplied data is encrypted or not when the supplied data is non-encrypted data; when the encryption is performed, executing an encrypting process to the supplied data and, thereafter, executing the encoding process by using the first error correction code; when the encryption is not performed, executing the encoding process by using a second error correction code; and recording the encoded data onto the recording medium.

According to the invention, there is provided a reproducing method of a recording medium, comprising the steps of: reading out designation data from the recording medium on which data and the designation data for identifying a kind of error correction code used in an error correction encoding process performed to the data have been recorded; and switching an error correcting process of the data read out from the recording medium on the basis of the read-out designation data.

According to the invention, there is provided a recording apparatus of a recording medium, comprising: a first encoder for performing an error correction encoding process based on a first error correction code to supplied data; a second encoder for performing an error correction encoding process based on a second error correction code to the supplied data; recording means to which output data from the first encoder and output data from the second encoder are supplied and which performs at least a modulating process to the output data from the first or second encoder and records the modulated data onto the recording medium; and a selecting unit for selecting either the first encoder or the second encoder to which the supplied data is supplied and supplying the supplied data to the first encoder when the supplied data is encrypted data.

According to the invention, there is provided a reproducing apparatus of a recording medium, comprising: a head unit for scanning the recording medium on which data that has been error correction encoded by at least either a first error correction code or a second error correction code and designation data to identify a kind of error correction code used in an error correction encoding process performed to the data have been recorded; a demodulating unit for demodulating an output signal from the head unit; a first decoder for executing an error correcting process to output data from the demodulating unit on the basis of the first error correction code; a second decoder for executing an error correcting process to the output data from the demodulating unit on the basis of the second error correction code; a selecting unit for selectively supplying the output data from the demodulating unit to either the first decoder or the second decoder; and a control unit for switching the selecting unit on the basis of the designation data read out from the recording medium.

According to the invention, there is provided a recording method of a recording medium, comprising the steps of: discriminating whether a compressing process is executed to supplied data or not; when the compressing process of the supplied data is executed, executing the compressing process to the supplied data and executing an error correction encoding process to the compressed data by a first error correction code; when the compressing process of the supplied data is not executed, executing an error correction encoding process by a second error correction code; and recording the encoded data onto the recording medium.

According to the invention, there is provided a recording apparatus of a recording medium, comprising: a first encoder for performing an error correction encoding process based on a first error correction code to supplied data; a second encoder for performing an error correction encoding process based on a second error correction code to the supplied data; recording means to which output data from the first encoder and output data from the second encoder are supplied and which performs at least a modulating process to the output data from the first or second encoder and records the modulated data onto the recording medium; and a selecting unit for selecting either the first encoder or the second encoder to which the supplied data is supplied and supplying the supplied data to the first encoder when the supplied data is compressed data.

According to the invention, the error correction encoding by the first and second error correction codes can be performed. The first error correction code having higher error correcting ability is used to encrypted data or data which is encrypted and recorded. The first error correction code having higher error correcting ability is used to compressed data or data which is compressed and recorded. Further, the first error correction code having higher error correcting ability is used to data which is recorded in a CD-ROM format. Thus, reliability can be raised in the case where data is charged for or contents data whose copy restriction is severe is recorded.

BEST MODE FOR CARRYING OUT THE INVENTION

Figure 1:
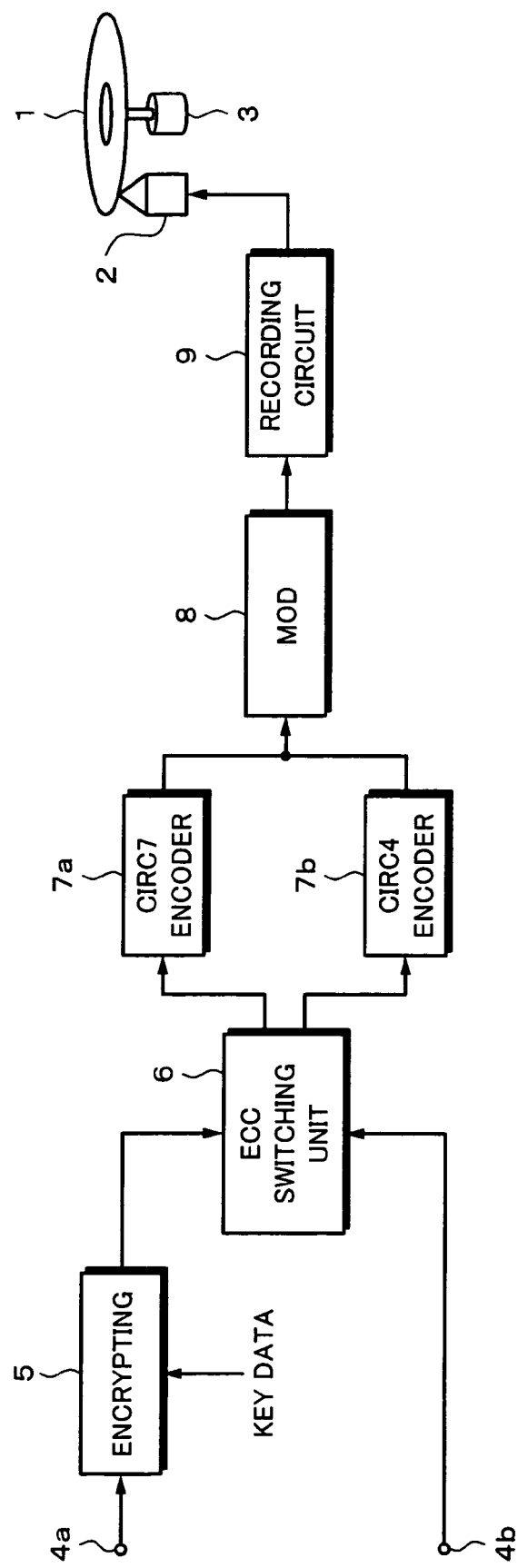
FIG. 1 is a block diagram showing a construction of an embodiment of a recording apparatus according to the invention.

An embodiment of the invention will be described hereinbelow. First, a recording apparatus according to the invention, for example, a mastering apparatus for manufacturing a read only disc serving as a recording medium, specifically speaking, an optical disc such as what is called a compact disc will be described with reference to FIG. 1. In FIG. 1, reference numeral 1 denotes a disc-shaped glass mother disc on which a photoresist as a photosensitive material has been coated, and 2 indicates an optical pickup. Although not shown, a gas laser such as Ar ion laser, He—Cd laser, Kr ion laser, or the like is optically modulated by a light modulator (not shown). A modulated laser beam is irradiated from the optical pickup 2 in a state where it is focused onto the photoresist on the glass mother disc 1.

The optical pickup 2 irradiates the modulated laser beam onto the glass mother disc 1. Optical parts such as an objective lens and the like for irradiating the modulated laser beam to a desired position in an in-focus state, a detector of the return beam, and the like are included in the optical pickup 2. The glass mother disc 1 is rotated by a spindle motor 3 at, for example, a CLV (Constant Linear Velocity). Further, although not shown, a servo control unit for a rotation of the spindle motor 3, focusing of the optical pickup 2, and the like is provided. The laser beam emitted from the optical pickup 2 scans from the inner rim side to the outer rim side of the glass mother disc 1 because the optical pickup 2 and the glass mother disc 1 are relatively moved in the radial direction of the glass mother disc.

The glass mother disc 1 whose photoresist has been exposed is developed and electroforming-processed by the mastering apparatus, thereby forming a metal master. Subsequently, a mother disc is formed from the metal master. Further, a stamper is formed from the mother disc. A disc substrate is manufactured by using the stamper and using a synthetic resin material having light transmittance by a method such as compression molding, injection molding, or the like. A reflective layer and a protective layer are formed onto the surface of the substrate on which concave and convex portions of the stamper have been transferred and a label is adhered onto the protective layer, so that a read only disc is completed.

The invention is not limited to the mastering apparatus but can be also applied to a recording apparatus using an optical disc such as CD-R (Recordable), CD-RW (ReWritable), MD (Mini Disc), or the like which can be recorded by a recording system, a phase change type recording system, a magnetooptic recording system, or the like using organic pigment. Wobbling grooves which wobble at a micro amplitude in the radial direction have previously been formed on those optical discs. Rotation control of the spindle motor, reproduction of addresses, and reproduction of a clock signal are executed by using a reproduction signal of the wobbling grooves. As mentioned above, the invention can be also applied to any of the mastering apparatus for manufacturing the read only disc and the recording apparatus using the recordable optical disc.

Secure contents data is supplied as recording contents data to an input terminal shown at reference numeral 4a. Non-secure contents data is supplied as recording contents data to an input terminal shown at 4b. The secure contents data denotes contents data in which encryption is necessary. Although there is music data as an example of the contents data, the invention is not limited to the music data but can be also applied to a case of handling image data, music and image data, or the like. In an encrypting circuit 5, the secure contents data is encrypted by using key data. The encrypted contents data and the non-secure contents data are supplied to an ECC switching unit 6. The secure contents data which has already been encrypted can be also supplied to the input terminal 4a. Further, a part of the contents data can be encrypted instead of encrypting the contents data by performing an encrypting process to all of the contents data. The non-secure contents data denotes contents data which does not need the encrypting process, that is, contents data of a plane sentence.

A DES (Data Encryption Standard) can be used as an encrypting system which is used in the encrypting process by the encrypting circuit 5. The DES is one of the block encrypting methods whereby data of a plane sentence is divided into blocks and an encryption conversion is executed every block of the divided block data. According to the DES, the encryption conversion is executed to an input of 64 bits by using a key of 64 bits (a key of 56 bits and a parity of 8 bits) and 64 bits are outputted. Naturally, as an encrypting system which is used in the encrypting circuit 5, an encrypting system other than the DES can be also used. For example, although the DES is a common key system using the same key data for encryption and decryption, it is also possible to use RSA encryption as an example of public key encryption in which different key data is used for encryption and decryption.

Error correction encoders 7a and 7b each having different error correcting ability are connected to the ECC switching unit 6. The error correcting ability of the error correction encoder 7a (ECCs) is higher than that of the error correction encoder 7b (ECCw). Particularly, error correction codes such that an error correction code which is added by the encoder 7a has higher correcting ability than that of an error correction code which is added by the encoder 7b in terms of burst error correcting ability are used.

In the embodiment, error correction codes by the CIRC (Cross Interleave Reed-Solomon Code) are used in the error correction encoders 7a and 7b. As will be explained herein later, an error correction code of a CIRC system in which an interleave length is equal to "4" (hereinafter, properly referred to as CIRC4) and an error correction code of a CIRC system in which an interleave length is equal to "7" (hereinafter, properly referred to as CIRC7) are used in the invention. The error correction encoder 7a executes an error correction encoding process by the system of CIRC7. The error correction encoder 7b executes an error correction encoding process by the system of CIRC4. The error correction code of the CIRC4 system is an error correction code used in the existing CD-DA and CD-ROM.

When the encryption data is inputted from the encrypting circuit 5, the ECC switching unit 6 supplies the inputted encryption data to the error correction encoder 7a and the error correction encoding process is executed to the encryption data by the system of CIRC7. When the non-secure contents data is inputted, the ECC switching unit 6 supplies the inputted non-secure contents data to the error correction encoder 7b and the error correction encoding process is executed to the non-secure contents data by the system of CIRC4. Output data of the encoders 7a and 7b is supplied to a common modulating circuit 8. The modulating circuit 8 executes a modulating process to the output data from the encoder 7a or 7b of, for example, an EFM (Eight to Fourteen Modulation) system.

Output data of the modulating circuit 8 is supplied to the optical pickup 2 via a recording circuit 9. The output data of the modulating circuit 8 is recorded onto the glass mother disc 1. The recording circuit 9 converts the output data from the modulating circuit 8 into a predetermined signal format. For example, the recording circuit 9 generates subcode data and records the data onto the glass mother disc 1 by a frame construction based on the standard of the CD. The embodiment is not limited to the case where the data which was error correction encoded by either the CIRC4 system or the CIRC7 system is recorded onto the disc but can be also applied to a case where the data encoded by the CIRC4 system and the data encoded by the CIRC7 system exist mixedly on the completed read only disc.

Subsequently, an outline of the frame construction of the CD will be described. In the CD, a parity Q of 4 symbols and a parity P of 4 symbols are formed from a total of 12 samples (24 symbols) of digital audio data of 2 channels by the CIRC4 system. 33 symbols (264 data bits) obtained by adding 1 symbol of the sub code data to those total of 32 symbols are handled as one frame. That is, 33 symbols comprising the sub code data, the data of 24 symbols, the Q parity of 4 symbols, and the P parity of 4 symbols are included in one frame obtained after EFM modulation.

In the EFM modulation, each symbol (8 data bits) is converted into 14 channel bits. Connection bits of 3 bits are arranged between the respective 14 channel bits. Further, a frame sync pattern is added to the head of the frame. When a period of the channel bits is assumed to be T, the frame sync pattern is set to a pattern in which 11T, 11T, and 2T are continuous. According to an EFM modulation rule, since such a pattern is not caused, a frame sync can be detected by a specific pattern. The total number of bits of one frame consists of 588 channel bits.

A set of 98 frames is called a subcode frame. A subcode frame shown by rearranging 98 frames so as to be continuous in the vertical direction comprises: a frame sync portion for identifying the head of the subcode frame; a subcode portion; data; and a parity portion. The subcode frame corresponds to $1/75$ second of a reproducing time of an ordinary CD. The subcode portion is formed by 98 frames. Respective bits in the subcode portion construct P, Q, R, S, T, U, V, and W channels. The P and Q channels are used for a track position control operation of the optical pickup upon reproduction of digital data recorded on the disc.

A sync bit portion (2 bits), a control bit portion (4 bits), an address bit portion (4 bits), a data bit portion (72 bits), and a CRC (Cyclic Redundancy Check Code) bit portion (16 bits) are included in one subcode frame (98 bits) of the Q channel. A tracking number, address information indicative of an absolute position and a relative position on the CD, and the like have been recorded in the data bit portion. The subcode of the Q channel is also recorded in a TOC (Table of Contents) data area in a lead-in area of the disc. Further, an absolute time when a lead-out area starts and an absolute time of an address in which each music piece or movement begins have been recorded.

By using the subcode of the Q channel which is recorded in the TOC data area, by either the error correction encoding method of the CIRC4 system or that of the CIRC7 system mentioned above the contents data which is recorded has been error correction encoded is shown. In the case where two or more contents data is recorded, in a manner similar to the address information of the address in which the music piece or movement begins, start address information of each contents data is recorded as a subcode. Designation information or designation data to identify to which error correction code of the CIRC4 system or the CIRC7 system each error correction encoding method corresponds is also recorded.

Figure 2:
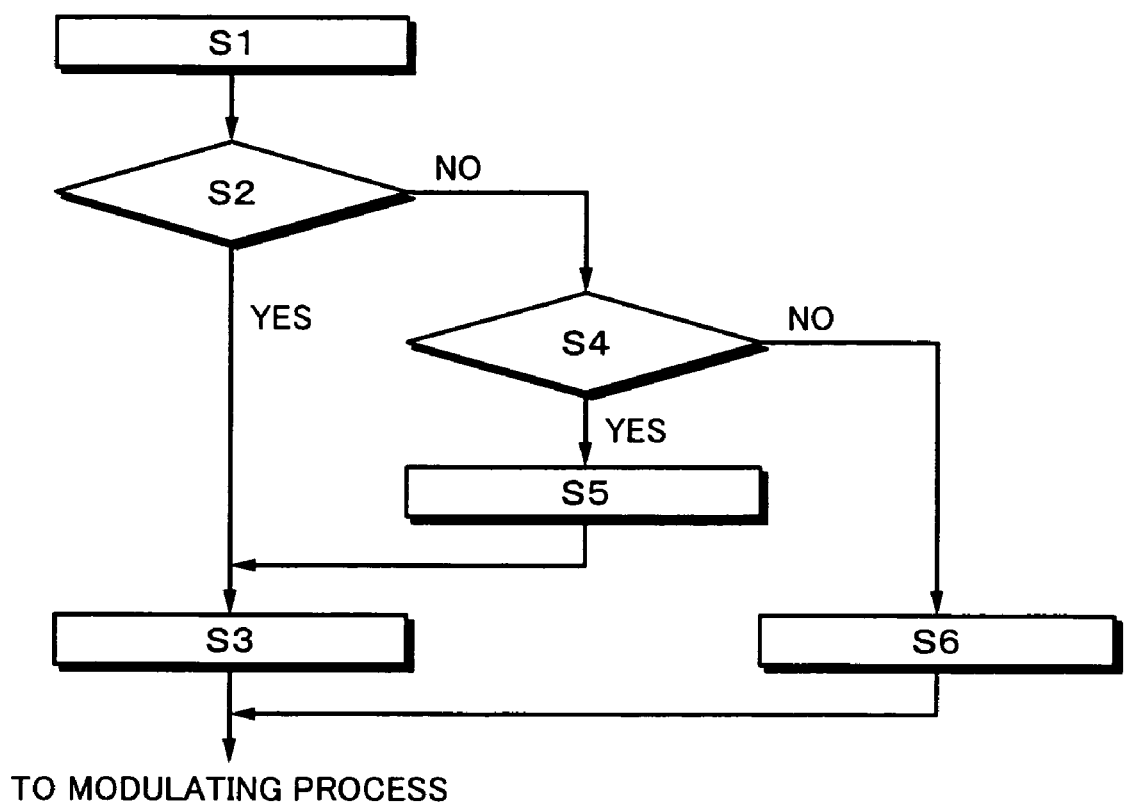
FIG. 2 is a flowchart for explaining an embodiment of a recording method according to the invention.

The operation of the recording apparatus shown in FIG. 1, particularly, the operation of the ECC switching unit 6 will be described with reference to FIG. 2. In first step S1, recording contents data is inputted to the input terminal 4a or 4b. In step S2, whether the recording contents data is encrypted contents data or not is discriminated. If it is determined that the inputted recording contents data is the encrypted contents data, in step S3, the encoder 7a executes the error correction encoding process to the encryption contents by the-system of CIRC7. After that, output data from the encoder 7a is supplied to the modulating circuit 8 and a modulating process is executed.

If it is determined in step S2 that the inputted recording contents data is not the encrypted contents data, whether encryption of the inputted recording contents data is necessary or not is discriminated in step S4. If it is determined in step S4 that the encrypting process is necessary, the inputted recording contents data is encrypted in step S5. After that, step S3 follows and the error correction encoding process by the system of CIRC7 is executed to the encrypted contents data by the encoder 7a. After that, the modulating process is executed to the output data from the encoder 7a by the modulating circuit 8.

If it is determined in step S4 that the encrypting process of the inputted contents data is unnecessary, step S6 follows. In the encoder 7b, the error correction encoding process is executed to the inputted recording contents data by the system of CIRC4. After that, the modulating process is executed to the output data from the encoder 7b by the modulating circuit 8. The process for switching whether the inputted recording contents data is encrypted or not in accordance with a result of the discrimination in step S4 in the flowchart of FIG. 2 cannot be performed by the construction of FIG. 1. A dissident point occurs between both constructions in terms of this point. However, the process in FIG. 2 can be realized by a construction such that a selector is provided on the input side of the encrypting circuit. 5 and one of two inputs is selected by the selector.

A reproducing apparatus for reproducing the read only disc formed on the basis of the master recorded by the mastering apparatus shown in FIG. 1 will now be described with reference to FIG. 3. Reference numeral 11 denotes a read only disc manufactured on the basis of the apparatus shown in FIG. 1 mentioned above. The disc 11 is rotated by a spindle motor 13, for example, at a constant linear velocity. A signal recorded on the disc 11 is read out by an optical pickup 12. The optical pickup 12 has: an optical system such as semiconductor laser, objective lens, and the like for irradiating a laser beam onto the disc 11; a detector for sensing the return light from the disc 11; a focusing and tracking mechanism for driving the objective lens in the focusing and tracking directions; and the like. The optical pickup 12 is further moved in the radial direction of the disc 11 by a sled mechanism (not shown). Thus, the disc 11 is scanned from the inner rim side of a recording area to the outer rim side by the optical pickup 12.

Output signals from, for example, 4-split detectors (not shown) of the optical pickup 12 are supplied to an RF amplifier 14. The RF amplifier 14 arithmetically operates the output signal of each of the 4-split detectors of the optical pickup 12, thereby forming a reproduction (RF) signal, a focusing error signal, and a tracking error signal. The reproduction signal is supplied to a demodulating circuit 15 for performing EFM demodulation. The formed focusing error signal and tracking error signal are supplied to a controller 16.

The controller 16 has a function as a system controller for controlling the operation of the whole reproducing apparatus and a function as a servo control unit. Although not shown, an operation unit and a display unit are connected to the controller 16. As a servo control unit, the controller 16 controls the rotating operation of the spindle motor 13 on the basis of a reproduction clock of the RF signal and drives a focusing and tracking mechanism on the basis of the focusing error signal and tracking error signal from the RF amplifier 14, thereby performing a focusing servo and a tracking servo of the optical pickup 12.

The demodulating circuit 15 executes an EFM demodulating process to the RF signal supplied from the RF amplifier 14. The demodulating circuit 15 outputs demodulation data on the basis of the supplied RF signal, separates the subcode data from the RF signal, and outputs it. The separated subcode data is supplied to the controller 16. The controller 16 decodes TOC data on the basis of a signal read out from a TOC data area on the disc 11 and decodes the subcode data. The error correcting method of the recorded data is known on the basis of the TOC data decoded by the controller 16. A recording position on the disc 11 of the data recorded on the disc 11 or a scanning position on the disc 11 of the optical pickup 12 are known by the decoded subcode data. It is possible to access a desired position on the disc by using the decoded subcode data. Ordinarily, in an initial state where the disc 11 is loaded into the reproducing apparatus, the optical pickup 12 is moved to the TOC data area on the disc 11 and the TOC data is read out.

The demodulation data from the demodulating circuit 15 is supplied to an input terminal of a selector 17. The selector 17 has output terminals a and b. The selector 17 is switched by a selection signal SL1 from the controller 16. An error correction decoder 18 for performing the error correcting process by the CIRC7 system is connected to one output terminal a of the selector 17. An error correction decoder 22 for performing the error correcting process by the CIRC4 system is connected to the other output terminal b of the selector 17.

Since designation information or data for identifying a kind of error correction code performed to the recording data or the data is included in the TOC data, the selection signal SL1 is formed by the controller 16 on the basis of the designation information or data. That is, if the data recorded on the disc 11 has been error correction encoded by the CIRC7 system, the selection signal SL1 is formed so that the selector 17 selects the output terminal a. If the data has been error correction encoded by the CIRC4 system, the selection signal SL1 is formed so that the selector 17 selects the output terminal b. If the recording data according to the two error correction encoding methods by each of the CIRC7 and CIRC4 systems as mentioned above exists mixedly on the disc 11, on the basis of the start position of each recording data and the information which designates the error correction encoding method, the selection signal SL1 for the selector 17 according to the scanning position of the optical pickup 12 on the disc 11 is formed in the controller 16.

The corrected output data of the error correction decoder 18 is supplied to an input terminal of a selector 19. A decoding circuit 20 of encryption is connected to one output terminal c of the selector 19. Key data for decryption is supplied to the decoding circuit 20. Contents data (secure contents data) whose encryption has been decrypted is taken out to an output terminal 21a of the decoding circuit 20. Encryption data obtained after completion of the error correction is supplied from the other output terminal d of the selector 19 to an output terminal 21b.

The selector 19 is controlled by a selection signal SL2. The selection signal SL2 is a signal to indicate whether the contents data whose encryption has been decrypted is outputted or the encrypted contents data is outputted. The selection signal SL2 is formed by the operation of the user via an operation unit (not shown) or automatically formed in the controller 16. Further, contents data (non-secure contents) which has been taken out from the other output terminal b of the selector 17 and error corrected by the error correction decoder 22 is outputted from an output terminal 21c.

Figure 3:
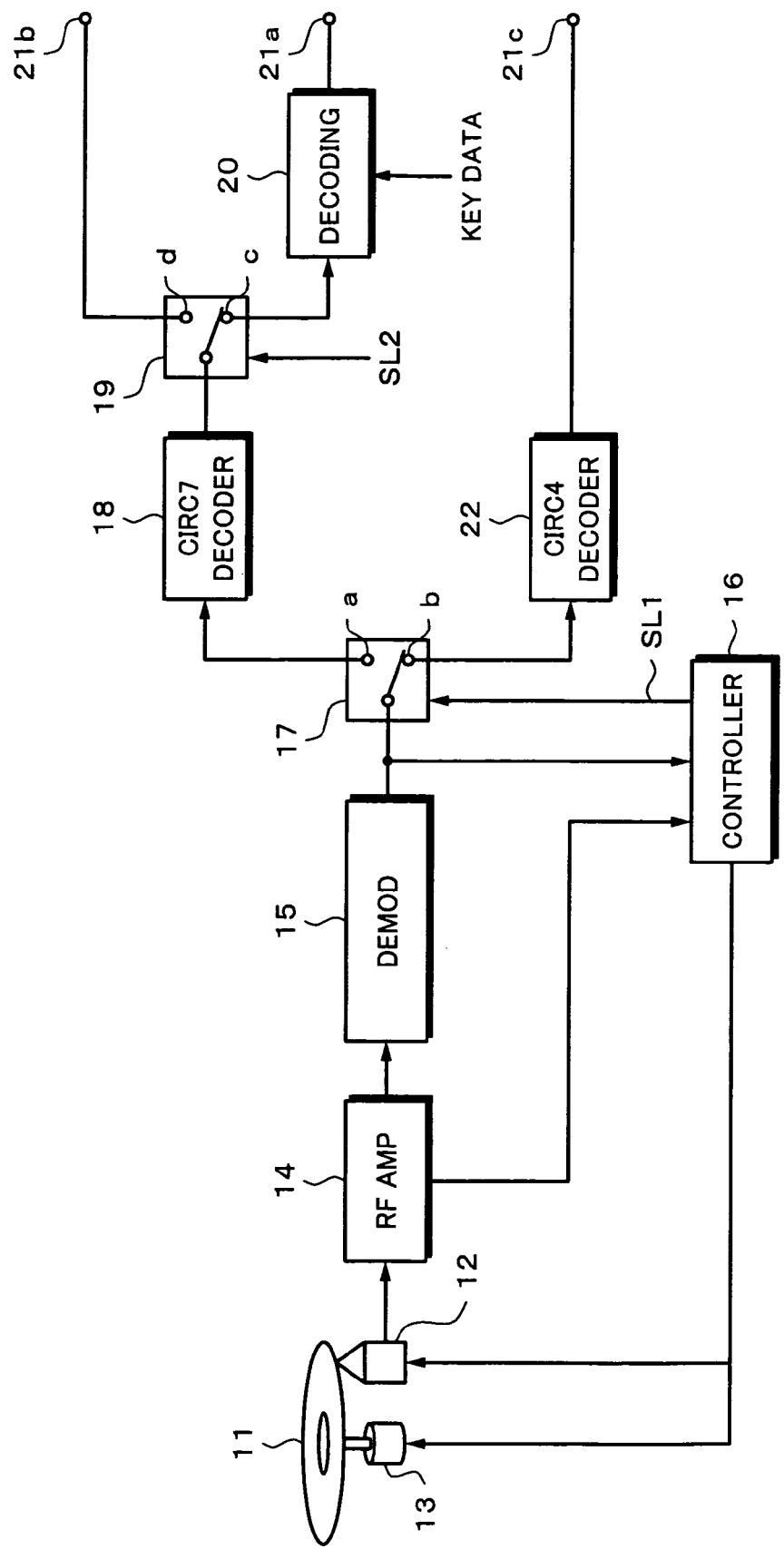
FIG. 3 is a block diagram showing a construction of an embodiment of a reproducing apparatus according to the invention.

When the disc 11 is loaded into the reproducing apparatus shown in FIG. 3, the optical pickup 12 is moved to the TOC data recording area on the disc 11 by the sled mechanism (not shown). The TOC data recorded in the TOC data area on the disc 11 is read out. Specifically speaking, the output signal from the optical pickup 12 is supplied to the RF amplifier 14 and the RF signal from the RF amplifier 14 is supplied to the demodulating circuit 15. The controller 16 decodes the TOC data from the output data supplied from the demodulating circuit 15. Designation information or designation data for identifying whether the error correction encoding system which is performed to the data recorded on the disc 11 is the system by CIRC7 or the system by CIRC4 or the system in which the system by CIRC7and the system by CIRC4 exist mixedly is obtained from the decoded TOC data.

The output-signal from the optical pickup 12 as a signal read out from the recording area on the disc 11 by the optical pickup 12 is supplied to the RF amplifier 14. The RF signal from the RF amplifier 14 is supplied to the demodulating circuit 15. The output data from the demodulating circuit 15 is supplied to the selector 17. At this time, the selector 17 is connected to either the output terminal a or the output terminal b by the selection signal SL1 from the controller 16. That is, if the foregoing designation information or designation data indicates that the error correction encoding system performed to the data recorded on the disc 11 is the system by CIRC7, the selector 17 is switched so as to be connected to the output terminal a. If the foregoing designation information or designation data indicates that the error correction encoding system performed to the data recorded on the disc 11 is the system by CIRC4, the selector 17 is switched so as to be connected to the output terminal b.

The output data from the demodulating circuit 15 supplied to the error correction decoder 18 via the selector 17 is subjected to an error detection and an error correcting process by the CIRC7 system in the decoder 18. The output data from the decoder 18 is supplied to the selector 19. The selector 19 is connected to the output terminal c or the output terminal d by the selection signal SL2 supplied from the controller 16. For example, when the operation unit (not shown) is operated by the user, that is, if the operation unit is operated so that the output data from the decoder 18 is outputted as encrypted data, the selector 19 is connected to the output terminal d by the selection signal SL2 supplied from the controller 16. The encrypted output data from the decoder 18, that is, the encrypted contents data is outputted from the output terminal 21b. If the operation unit is operated by the user so that the encryption of the output data from the decoder 18 is decrypted and outputted, the selector 19 is connected to the output terminal c by the selection signal SL2 from the controller 16.

The output data from the decoder 18 supplied to the decoding circuit 20 via the selector 19 is subjected to a decrypting process for decrypting the encryption in the decoding circuit 20 by the key data. Thus, when the data recorded on the disc 11 is the secure contents data, the contents data whose encryption has been decrypted is outputted from the output terminal 21a.

If the selector 17 is connected to the output terminal b, that is, if the designation information or the designation data indicates that the error correction encoding system performed to the data recorded on the disc 11 is the system by CIRC4, the output data from the demodulating circuit 15 is supplied to the error correction decoder 22 via the selector 17. In the error correction decoder 22, the error detection and error correcting process by the CIRC4 system is performed to the output data from the demodulating circuit 15. Thus, if the data recorded on the disc 11 is the non-secure contents data, the data is outputted from the output terminal 21c.

In the foregoing reproducing apparatus, the case where the selection signal SL2 for switching the selector 19 so as to be connected to either the output terminal d or the output terminal c is formed by the controller 16 on the basis of the input data from the operation unit by the user has been described as an example. The invention is not limited to such an example but, for instance, in the case where an external apparatus serving as an output destination connected to the reproducing apparatus is the recording apparatus or an apparatus which cannot be correctly authenticated by the reproducing apparatus shown in FIG. 3, the controller 16 can also automatically form the selection signal SL2 for allowing the selector 19 to be connected to the output terminal d. In this case, if the foregoing external apparatus is an audio apparatus without a recording function such as an amplifier or the like other than the recording apparatus or an apparatus which can be correctly authenticated by the reproducing apparatus shown in FIG. 3, the controller 16 forms the selection signal SL2 for allowing the selector 19 to be connected to the output terminal c.

As key data which is supplied to the decoding circuit 20, it is possible to read out key data which has previously been recorded on the disc 11 and use it or to use the key data which has previously been stored in the controller 16 of the reproducing apparatus. Further, the reproducing apparatus can also obtain the key data from the outside via the network.

Subsequently, another embodiment of the invention will be described with reference to FIG. 4. In the foregoing embodiment, the secure (encrypted) contents is error correction encoded by the CIRC7 system and the non-secure contents is error correction encoded by the CIRC4 system. In another embodiment, a linear PCM signal, that is, non-compression audio data is error correction encoded by the CIRC4 system and recorded in the CD-DA format. Compression audio data is error correction encoded by the CIRC7 system and recorded in the CD-ROM format.

Figure 4:
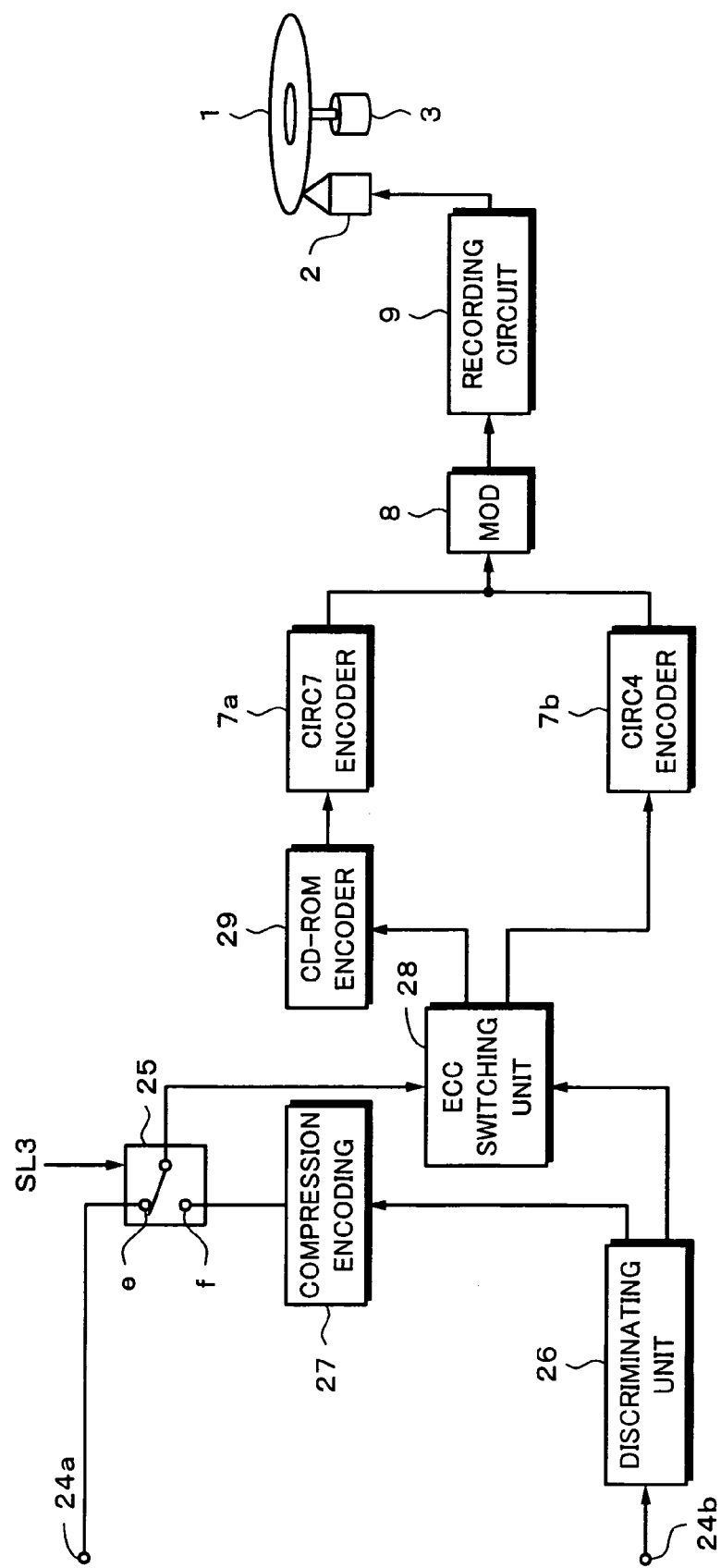
FIG. 4 is a block diagram showing a construction of another embodiment of a recording apparatus according to the invention.

FIG. 4 shows the mastering apparatus and portions corresponding to those in FIG. 1 are designated by the same reference numerals. That is, the modulated laser beam is irradiated via the optical pickup 2 onto the disk-shaped glass mother disc 1 on which the photoresist has been coated. The glass mother disc 1 is rotated by the spindle motor 3 at, for example, a constant linear velocity. The photoresist develops the glass mother disc 1 exposed by the laser beam from the optical pickup 2 and executes the electroforming process, thereby forming a metal master. Subsequently, a mother disc is formed from the formed metal master. Further, a stamper is formed from the mother disc. A disc substrate is manufactured by using the stamper. A reflective layer and a protective layer are formed onto the surface of the disc substrate on which concave and convex portions of the stamper have been transferred and a label is adhered onto the protective layer, so that a read only disc is manufactured.

The output data of the error correction encoders 7a and 7b are supplied to the common EFM modulating circuit 8. The output data of the-modulating circuit 8 is supplied to the optical pickup 2 via the recording circuit 9. The output data of the modulating circuit 8 is recorded onto the glass mother disc 1. The recording circuit 9 converts the data from the modulating circuit 8 into a format and a data format of a frame construction based on the standard of the CD. In a manner similar to the embodiment, also in another embodiment, the invention is not limited to the case where the data which has been error correction encoded by either the CIRC4 system or the CIRC7 system is recorded onto the disc but it is also possible to construct in a manner such that the data which has been error correction encoded by the CIRC4 system and the data which has been error correction encoded by the CIRC7 system exist mixedly.

In FIG. 4, reference numerals 24a and 24b denote input terminals to which contents data to be recorded, for example, music contents data is supplied. Compression audio data is supplied to the input terminal 24a. Linear PCM data is supplied to the input terminal 24b. The compression audio data inputted from the input terminal 24a is supplied to one input terminal e of a selector 25.

A linear PCM signal is supplied to a discriminating unit 26. The discriminating unit 26 discriminates whether a compressing process is necessary for the inputted linear PCM signal or not. If the discriminating unit 26 determines that the compressing process is necessary, the linear PCM signal is supplied to a compression encoding unit 27. The compression encoding unit 27 supplies data obtained by compressing the supplied linear PCM signal to another input terminal f of the selector 25. The selector 25 is controlled by a selection signal SL3. The selection signal SL3 is an input selection signal and formed by the operation of the user or automatically formed. The compression data from an output terminal of the selector 25 is supplied to an ECC switching unit 28. The linear PCM signal from the discriminating unit 26 is also supplied to the ECC switching unit 28.

As a compression encoding which is executed by the compression encoding unit 27, AAC (Advanced Audio Coding) of MPEG2 (Moving Picture Experts Group Phase 2), MP3 (MPEG1 Audio Layer III), ATRAC (Adaptive Transform Acoustic Coding), ATRAC3, or the like can be used. According to ATRAC3, ATRAC used in what is called an MD (Mini Disc) is improved, thereby realizing a higher compression ratio (about ½ of that in the case of ATRAC, about 1/11 of that in that case of CD-DA).

One output data of the ECC switching unit 28 is supplied to a CD-ROM encoder 29. The CD-ROM encoder 29 converts the format of the output data from the ECC switching unit 28 into the data format of the CD-ROM. For example, as a file format which is used in the CD-ROM encoder 29, a file format such that audio data is stored into a user area of the CD-ROM format is used. Thus, the audio data of CD-DA can be handled on a personal computer. Output data of the CD-ROM encoder 29 is supplied to the error correction encoder 7a of the CIRC7 system. The other output data of the ECC switching unit 28 is supplied to the error correction encoder 7b of the CIRC4 system. The output data of the error correction encoders 7a and 7b is supplied to the optical pickup 2 via the modulating circuit 8 and the recording circuit 9 and recorded onto the glass mother disc 1 by the optical pickup 2.

Figure 5:
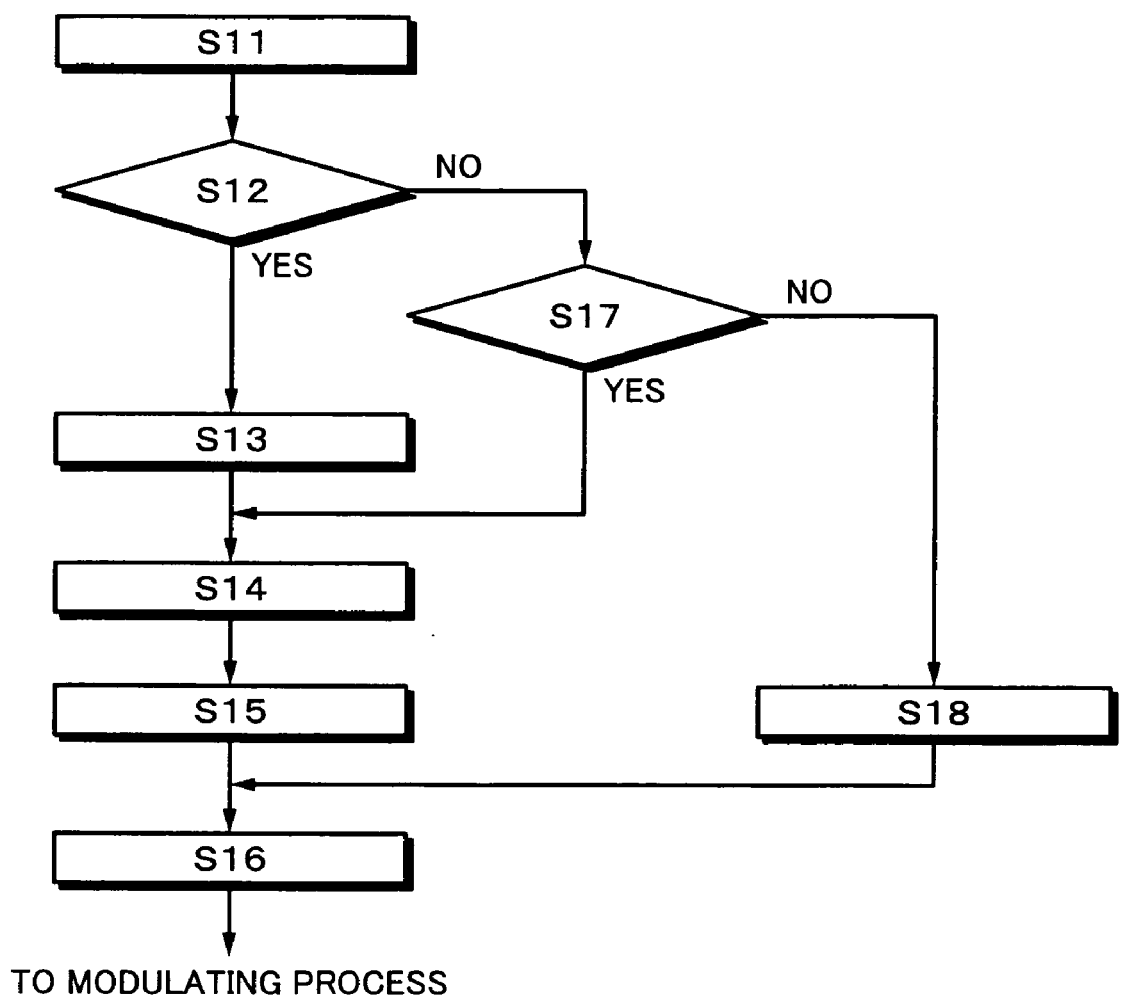
FIG. 5 is a flowchart for explaining another embodiment of a recording method according to the invention.

The operation of a recording apparatus in another embodiment shown in FIG. 4, particularly, the operations of the discriminating unit 26 and the ECC switching unit 28 will be explained with reference to FIG. 5. In first step S11, the recording contents data is inputted to the input terminal 24b. In step S12, whether the inputted recording contents data is compressed and recorded or not is discriminated. If it is determined that the inputted recording contents data is compressed and recorded, step S13 follows and the inputted recording contents data is supplied to the compression encoding unit 27 and compression encoded by the compression encoding unit 27.

The compression encoded data compressed by the compression encoding unit 27 is supplied to the CD-ROM encoder 29 via the selector 25 and the ECC switching unit 28. The compression encoded data is converted into the CD-ROM format (step S14). In step S15, an error correction encoding process is performed to the compression encoded audio data of the CIRC7 system by the error correction encoder 7a. After that, subcode data is added to the data to which the error correction encoding process has been performed (step S16). The modulating process is further executed by the modulating circuit 8.

If it is determined in step S12 that the compression recording of the inputted recording contents data is unnecessary, step S17 follows and whether the CD-ROM formatting is necessary or not is discriminated. If it is determined in step S17 that the CD-ROM formatting is necessary, the processing routine advances to the CD-ROM formatting process in step S14. After that, step S15 follows and the error correction encoding by the CIRC7 system and the addition of the subcode data (step S16) are executed as mentioned above. In this case, therefore, the linear PCM data as inputted recording contents data is converted into the CD-ROM format (the linear PCM data in a file format) and recorded onto the glass mother disc 1.

If it is determined in step S17 that the conversion of the inputted recording contents data into the CD-ROM format is unnecessary, step S18 follows. The linear PCM data as inputted recording contents data is supplied to the encoder 7b and the error correction encoding process by the CIRC4 system is executed. The processing routine advances to step S16 and a process for adding the subcode data is executed and, subsequently, the modulating process by the modulating circuit 8 is executed. In this case, the linear PCM data is recorded onto the glass mother disc 1 so as to have a data construction similar to that of the CD-DA, that is, in a format similar to the data format of what is called a compact disc. If the compression data inputted from the input terminal 24a is the recording contents data, steps S12 and S13 are omitted and a processing routine starting from step S17 is executed.

A data format of the CD-ROM (specified in the standard book called "Yellow Book") will now be described. In the CD-ROM, 2352 bytes as data included in 98 frames of one period of the subcode are set to an access unit. The access unit is also called a block or a sector. A length of frame is equal to the same length, that is, 1/75 second as that of a subcode frame of the CD mentioned above. As formats of the CD-ROM, there are a plurality of modes of Mode 0, Mode 1, Mode 2 (Form 1), and Mode 2 (Form 2). The formats are slightly different in dependence on those modes.

That is, the data format in Mode 0 of the CD-ROM format is formed by a data portion of 2336 bytes all of which are equal to "0". Mode 0 is defined as an area meaning nonuse.

The data format in Mode 1 of the CD-ROM format is formed by: a sync portion of 12 bytes in which a signal for segmenting the frame has been recorded; a user data portion of 2048 bytes (2 kbytes) in which data such as contents data or the like is written; and an auxiliary data portion of 288 bytes in which error detection/correction codes have been recorded. According to Mode 1, the error correcting ability is improved by providing the auxiliary data portion.

The data format in Mode 2 (Form 1) of the CD-ROM format is formed by: a sync portion of 12 bytes in which the signal for segmenting the frame has been recorded; a header portion of 4 bytes; a subheader portion of 8 bytes; a user data portion of 2048 bytes in which the data such as contents data or the like is written; and an auxiliary data portion of 280 bytes in which the error detection/correction codes have been recorded.

The data format in Mode 2 (Form 2) of the CD-ROM format is formed by: a sync portion of 12 bytes in which the signal for segmenting the frame has been recorded; a header portion of 4 bytes; a subheader portion of 8 bytes; a user data portion of 2324 bytes in which the data such as contents data or the like is written; and an EDC (Error Detection Code) portion of 4 bytes. In Mode 2 (Form 2), since the format does not have the auxiliary data portion other than the EDC, the error correction encoding process is not performed to the data based on the format in Mode 2 (Form 2).

A file number, a channel number, a submode, coding information, a file number, a channel number, a submode, and coding information each consisting of one byte are included in the subheader portion of the CD-ROM format.

In the CD-ROM encoder 29 in FIG. 4, any of the modes of the CD-ROM format mentioned above can be used. In the data based on the format in Mode 2 (Form 2), since the error correction encoding is not performed to the sector, there is a problem such that such data is weak against random errors. In the case of recording audio data, therefore, for example, the format in Mode 1 is used in the CD-ROM encoder 29. A data transfer rate of the data based on the CD-ROM format is equal to 150 kbytes/sec.

Further, irrespective of the foregoing modes the header portion in the existing CD-ROM format is constructed by: an absolute address portion (ADDRESS) consisting of 24 bits in which an absolute address of the frame is expressed by time information of a minute (MIN), a second (SEC), and a frame number (FRAME); and a mode portion (MODE) consisting of 8 bits indicative of one of the foregoing modes. The absolute address portion (ADDRESS) is constructed by: an absolute address minute component portion (MIN); an absolute address second component portion (SEC); and an absolute address frame number component portion (FRAME). Each of those portions is data of 8 bits. The absolute address portion (ADDRESS) is equivalent to the time information of the Q channel of the subcode in the CD-DA format, that is, they correspond in a one-to-one correspondence relational manner. Each of the absolute address minute component portion (MIN), the absolute address second component portion (SEC), and the absolute address frame number component portion (FRAME) is expressed by a BCD of two digits.

Figure 6:
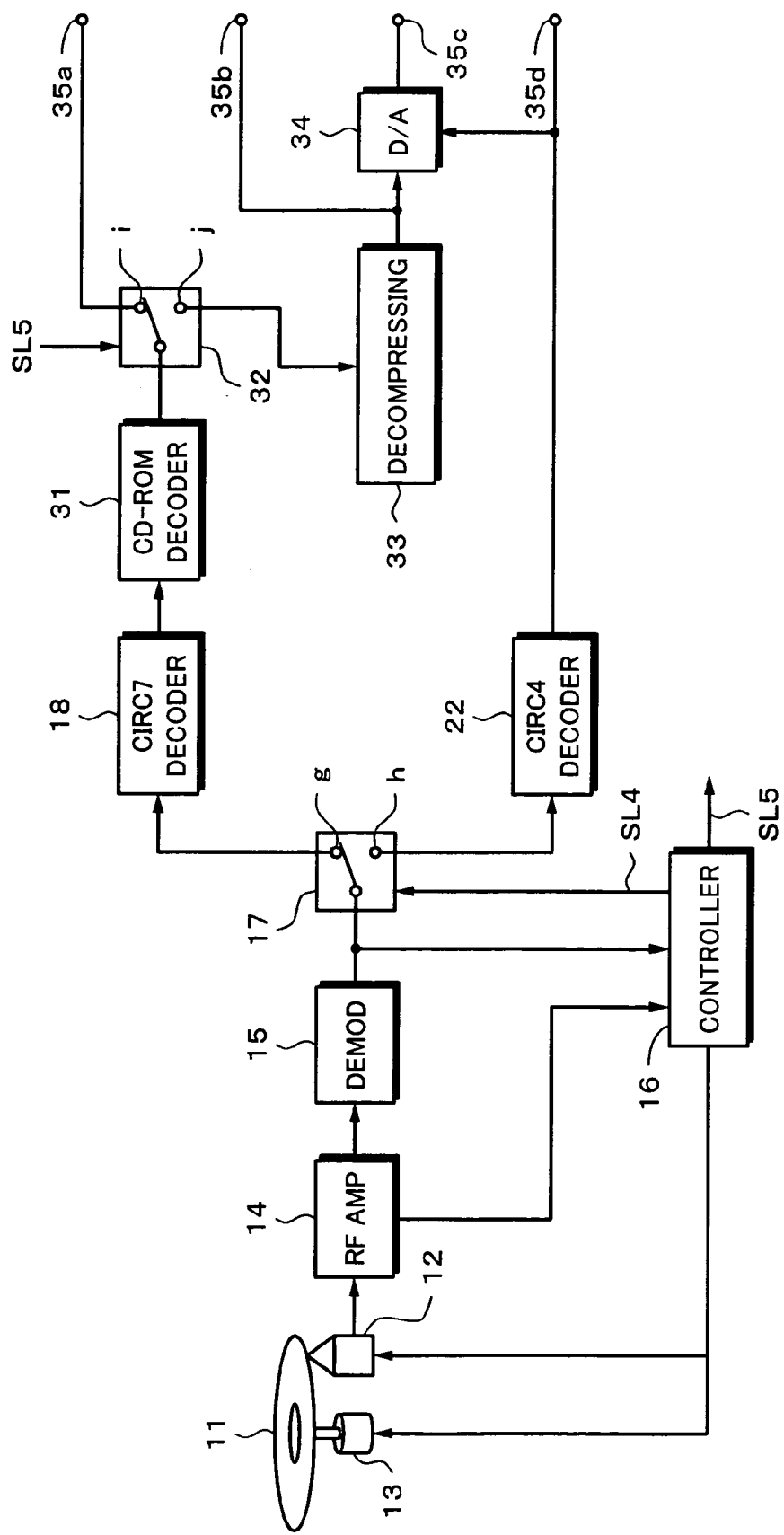
FIG. 6 is a block diagram showing a construction of another embodiment of a reproducing apparatus according to the invention.

The reproducing apparatus for reproducing the read only disc formed on the basis of the master recorded by the mastering apparatus shown in FIG. 4 will now be described with reference to FIG. 6. Portions corresponding to those in the reproducing apparatus shown in FIG. 3 mentioned above are designated by the same reference numerals. That is, the disc 11 is rotated by the spindle motor 13, for example, at a constant linear velocity and the signal recorded on the disc 11 is read out by the optical pickup 12. The output signal from the optical pickup 12 is supplied to the RF amplifier 14. The reproduction signal from the RF amplifier 14 is supplied to the demodulating circuit 15 for performing EFM demodulation. The focusing error signal and tracking error signal formed by the RF amplifier 14 are supplied to the controller 16.

The subcode data from the demodulating circuit 15 is supplied to the controller 16. The demodulation data as output data from the demodulating circuit 15 is supplied to the input terminal of the selector 17. The selector 17 has output terminals g and h. The selector 17 is switched by a selection signal SL4 from the controller 16. The error correction decoder 18 for performing the error correcting process by the CIRC7 system is connected to one output terminal g of the selector 17. The error correction decoder 22 for performing the error correcting process by the CIRC4 system is connected to the other output terminal h of the selector 17.

Since designation information or designation data for designating the error correction encoding method of the recording data is included in the TOC data in a manner similar to the reproducing apparatus shown in FIG. 3, the selection signal SL4 is formed in the controller 16 on the basis of the TOC data. Usually, in the initial state where the disc 11 has been loaded into the reproducing apparatus, for example, just after the disc 11 was loaded into the reproducing apparatus before the reproducing operation of the disc 11 is started, the TOC data is read out from the TOC area on the disc 11 by the optical pickup 12 before the data recorded in the data recording area on the disc 11 is read out.

The selection signal SL4 is formed in the controller 16 on the basis of the designation information or designation data indicative of the error correction encoding method of the recording data in the TOC data. If the data recorded on the disc 11 has been error correction encoded by the CIRC7 system, the selector 17 is switched so as to select the output terminal g by the formed selection signal SL4. If the data has been error correction encoded by the CIRC4 system, the selector 17 is switched so as to select the output terminal h on the basis of the formed selection signal SL4. If the recording data subjected to the error correction encoding process by either the error correction encoding method of the CIRC7 system or that of the CIRC4 system exists mixedly on the disc 11, the selection signal SL4 for the selector 17 is formed by the controller 16 on the basis of the start position and the designation information for designating the error correction encoding method of the recording data.

Further, identification information showing whether the data recorded on the disc 11, that is, the data which was error correction encoded by the CIRC7 system is the compression data or the linear PCM data has been recorded as TOC data in the TOC data area on the disc 11. The controller 16 forms a selection signal SL5 on the basis of the ID information read out from the TOC data area.

The corrected output data of the error correction decoder 18 is supplied to a CD-ROM decoder 31. The CD-ROM decoder 31 executes a decomposing process of the CD-ROM format and error detecting and error correcting processes and separates the data recorded as user data. The data recorded as user data separated by the decoder 31 is supplied to an input terminal of a selector 32.

One output terminal i of the selector 32 is taken out as an output terminal 35a. A decompressing circuit 33 for decoding the compression-encoded data from the CD-ROM decoder 31 is connected to the other terminal j of the selector 32. Digital audio data which is outputted from the decompressing circuit 33 is outputted from an output terminal 35b and supplied to a D/A converter 34. The digital data from the decompressing circuit 33 is converted into an analog signal by the D/A converter 34 and outputted as an analog output to an output terminal 35c. The selector 32 is switched by the selection signal SL5 which is supplied from the controller 16. If the data which is outputted from the CD-ROM decoder 31 is the linear PCM data, the output terminal i is selected. In the case of the compression audio data, the output terminal j is selected.

The audio data in the CD-DA format outputted from the output terminal h of the selector 17 is supplied to the decoder 22 according to the CIRC4 system and subjected to a decoding process of the error correction code according to the CIRC4 system. The decoding data as output data of the decoder 22 according to the CIRC4 system is outputted as a digital output from an output terminal 35d, converted into the analog signal by the D/A converter 34 and outputted as an analog output to the output terminal 35c.

The invention will be summarized and explained herein below with reference to the embodiment of the invention mentioned above and the other embodiment. In the invention, two kinds of error correction codes (ECCs and ECCw) are used. For example, ECCs is the error correction code according to the CIRC7 system and ECCw is the error correction code according to the CIRC4 system. In the embodiment, the secure contents (encryption contents) data is error correction encoded by the error correction code according to the CIRC7 system and the non-secure contents data is error correction encoded by the error correction code according to the CIRC4 system. Those processes are called a first application.

According to a second application, the linear PCM data is error correction encoded by the error correction code according to the CIRC4 system and the compression data is error correction encoded by the error correction code according to the CIRC7 system. According to a third application, the data in the CD-DA format is error correction encoded by the error correction code according to the CIRC4 system and the data in the CD-ROM format is error correction encoded by the error correction code according to the CIRC7 system.

Those first, second, and third application can be arbitrarily combined. In the other embodiment mentioned above, in the case where the compression data or the linear PCM data is converted into the CD-ROM format, the error correction encoding by the error correction code according to the CIRC7 system is executed, and the data (CD-DA data) which is not converted into the CD-ROM format in the linear PCM data is error correction encoded by the error correction code according to the CIRC4 system. However, the invention can be also modified in a manner such that only the data converted into the CD-ROM format in the compression data is error correction encoded by the error correction code according to the CIRC7 system. By allowing the AND (logical product) or OR (logical sum) of the elements of the signal processes for "encryption", "compression", and "CD-ROM formatting" to be associated with "CIRC7" and "CIRC4" as mentioned above, various modifications can be realized.

Figure 7:
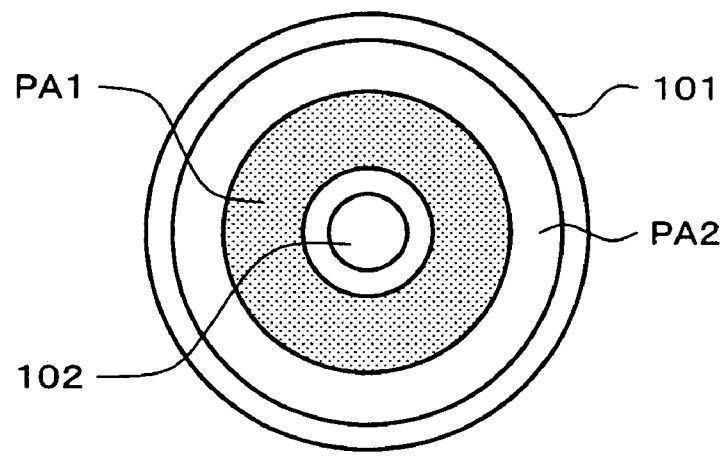
FIG. 7 is a schematic diagram showing an outline of a disc according to the invention.
Figure 8:
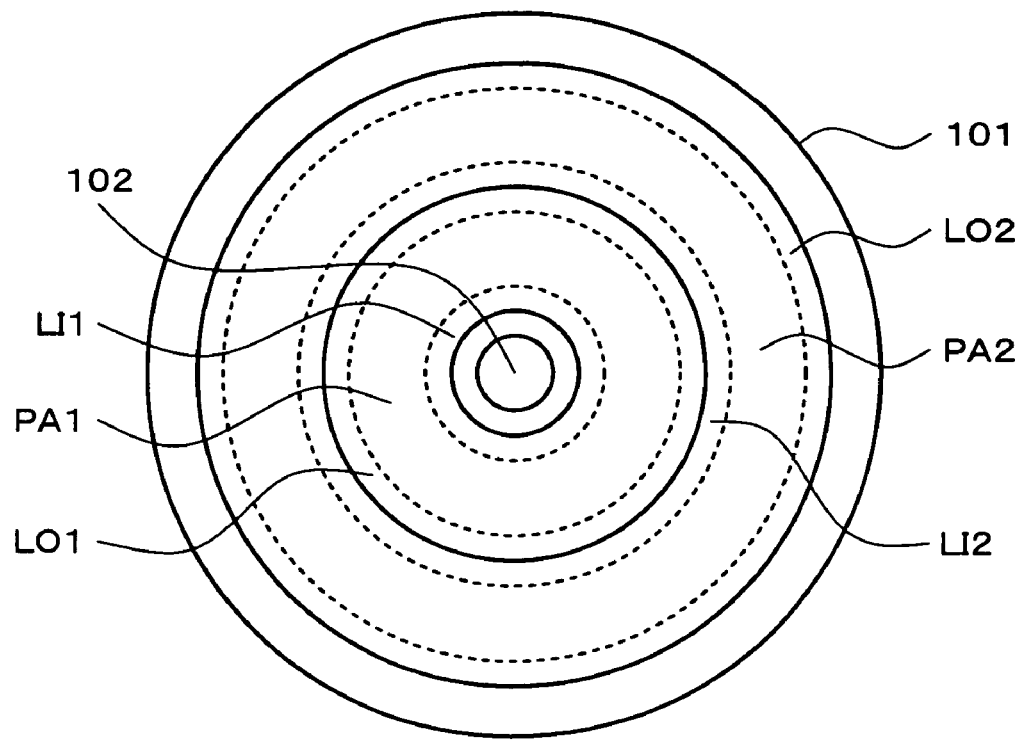
FIG. 8 is a schematic diagram showing the disc according to the invention in more detail.

FIGS. 7 and 8 show a data recording medium having a plurality of sessions to which the invention is applied, for example, a read only disc 101. The disc 101 is molded by using the formed stamper from the glass mother disc formed by using the recording apparatus shown in FIG. 4. The disc 101 is an optical disc on which a recording area is divided into halves in the radial direction and a first recording area PA1 and a second recording area are formed. The audio data which has been error correction encoded by the error correction code according to the CIRC4 system is recorded as first data in the CD-DA format into, for example, the first recording area PA1 on the inner rim side of the disc 101. The second data in which all of the compression encoding, the encryption, and the CD-ROM formatting have been performed and which has been error correction encoded by the error correction code according to the CIRC7 system is recorded in the second recording area PA2 on the outer rim side of the disc 101. A center hole 102 is formed in a center portion of the disc 101. Although the case where the recording area has been divided into two recording areas has been shown in the example illustrated in FIGS. 7 and 8, the recording area can be also divided into three or more recording areas.

The disc 101 having the two recording areas shown in FIG. 7 will be described in more detail. The disc 101 is formed so that a diameter is equal to 12 cm and a thickness is equal to 1.2 mm so as to have compatibility with the existing CDs. As shown in FIG. 8, a lead-in area LI1 is arranged to an outer rim of a clamping area on the innermost rim side of the disc 101. The first recording area PA1 as a program area is arranged outside of the lead-in area LI1. A lead-out area LO1 is arranged outside of the first recording area PA1. A lead-in area LI2 is arranged outside of the lead-out area LO1. The second recording area PA2 as a program area is arranged outside of the lead-in area LI2. A lead-out area LO2 is arranged outside of the second recording area PA2. For example, recording densities of the first recording area PA1 and the second recording area PA2 are equal and set to, for example, the same value as the recording density of the CD-DA. The clamping area of the disc 101 is an area which is held by a disc table (not shown) and a clamper (not shown) which are provided for the spindle motor 13 of the reproducing apparatus when the disc 101 is loaded into the reproducing apparatus as shown in FIG. 6.

That is, according to the standard (called "Red Book") of the existing CDs, that is, according to the foregoing CD-DA format, a track pitch is specified to 1.6 $\mu$m±0.1 $\mu$m and a linear velocity in the CLV (Constant Linear Velocity) is specified to 1.2 m/sec to 1.4 m/sec. The lead-in area LI1, the first recording area PA1, and the lead-out area LO1 satisfy the standard of the existing CDs. Therefore, the existing CD reproducing apparatus can reproduce the audio data recorded in the first recording area PA1 without any trouble in a manner similar to the existing CDs.

For example, the data in a file format which has been encrypted, CD-ROM formatted, encoded on the basis of, for instance, Mode 2 Form 1 of the CD-ROM format mentioned above, further error correction encoded by the error correction code according to the CIRC7 system, for example, the compression audio data, linear PCM in the file format, text data, still image data, and the like have been recorded in the second recording area PA2. Therefore, the data recorded in the second recording area PA2 cannot be reproduced by the existing reproducing apparatus but can be reproduced by the reproducing apparatus corresponding to a new format.

Medium identification information to distinguish whether the disc is the disc of the same CD-DA standard as that of the compact disc on which music data has been recorded as contents data which is put on the market has been recorded or the multisession disc 101 mentioned above has been recorded as TOC data in the lead-in area LI1 on the disc 101. Further, in the case of the multisession disc 101, position information indicative of a switching position of the two recording areas has also been recorded as TOC data. Therefore, by reading out the TOC data, the disc reproducing apparatus can recognize that the data recorded in the first recording area PA1 has been error correction encoded by the error correction code in the CD-DA format, that is, according to the CIRC4 system and the data recorded in the second recording area PA2 has been encrypted and error correction encoded by the error correction code in the CD-ROM format, that is, according to the CIRC7 system. Further, since data identification information to identify the presence or absence of the compression, the compression system, and whether the data is the linear PCM data in the file format or not, or the like has been recorded in the file header of the data recorded in the second recording area PA2, the disc reproducing apparatus can select the proper reproducing process with reference to the file header.

Figure 9:
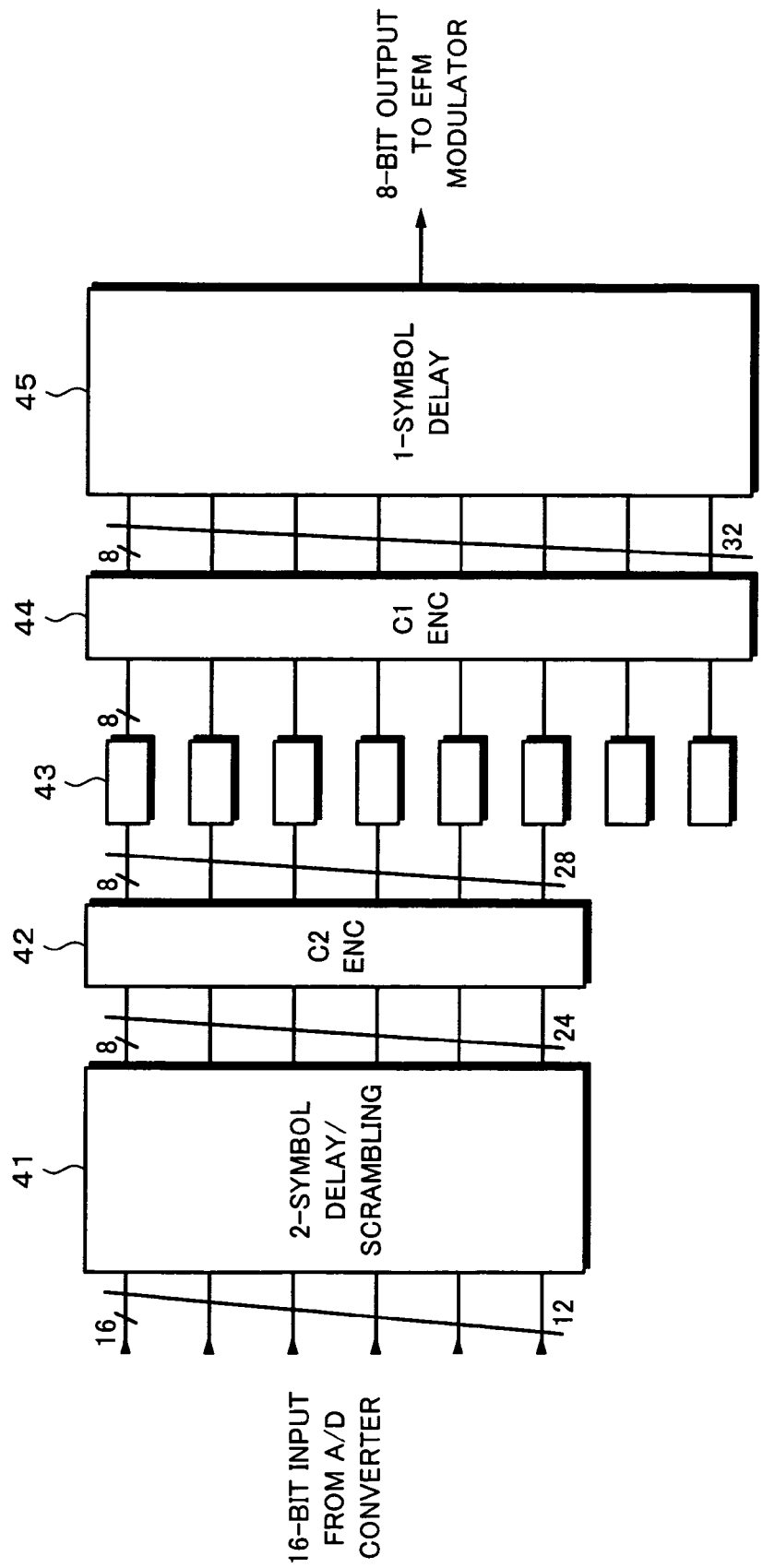
FIG. 9 is a block diagram showing an outline of an example of an error correction encoder which can be used in the invention.
Figure 10:
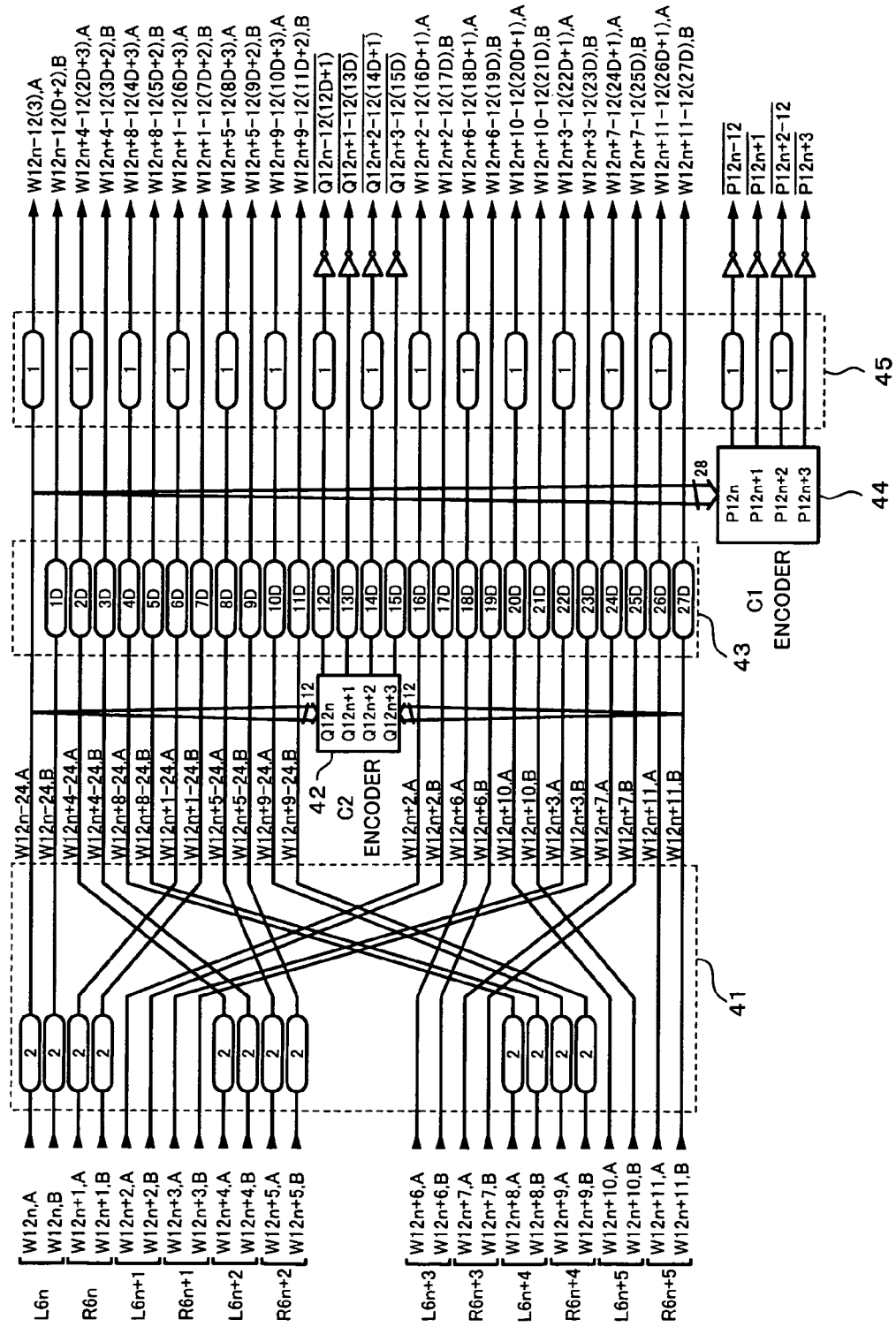
FIG. 10 is a block diagram showing in more detail an example of the error correction encoder which can be used in the invention.

The error correction encoding process according to each of the CIRC4 and CIRC7 systems as an example of the error correction encoding will be described. FIG. 9 shows an outline of the encoding process of the CIRC. FIG. 10 shows its details. Constructions shown in FIGS. 9 and 10 correspond to the constructions of the encoders 7a and 7b of the recording apparatus shown in FIG. 1. FIG. 10 is a block diagram shown along an encoding flow. 24 symbols (W12$n$, A, W12$n$,B, . . . W12$n$+11,A, W12n+11,B) (upper 8 bits are shown by A, lower 8 bits are shown by B) obtained by dividing one word of an audio signal into upper 8 bits and lower 8 bits are supplied to a 2-symbol delay/scrambling circuit 41. A 2-symbol delay is executed to data L6$n$, R6$n$, L6$n$+2, R6$n$+2, . . . of even-number words. Even if all of corresponding series become errors in a C2 encoder 42, the erroneous data can be interpolated. A scrambling is performed so as to obtain a maximum burst error interpolation length.

An output from the 2-symbol delay/scrambling circuit 41 is supplied to the C2 encoder 42. The C2 encoder 42 executes an encoding of the (28, 24, 5) Reed Solomon Code on GF ($2^8$), so that Q parities Q12$n$, Q12$n$+1, Q12$n$+2, and Q12$n$+3 of 4 symbols are generated.

28 symbols of an output of the C2 encoder 42 are supplied to an interleaving circuit 43. Assuming that an interleave length is set to D, the interleaving circuit 43 changes a first arrangement of symbols to a second arrangement by giving a delay amount which changes arithmetically to 0, D, 2D, . . . to each symbol.

In the case of the error correction code of the CIRC4 system used also in the existing CD-DA format, D= 4 frames and the adjacent symbols are separated every four frames. The burst errors are distributed by the interleaving circuit 43. The maximum delay amount is set to 27D (=108 frames) and the total interleave length is set to 109 frames. As will be explained hereinlater, according to the error correction code of the CIRC7 system, the total interleave length is set to a value which is integer times as large as 98 frames or a value which is slightly smaller than the value that is integer times as large as 98 frames.

An output of the interleaving circuit 43 is supplied to a C1 encoder 44. The (32, 28, 5) Reed Solomon Code on GF($2^8$) is used as a C1 code. P parities P12n, P12n+1, P12$n$+2, and P12$n$+3 of 4 symbols are generated from the C1 encoder 44. A minimum distance of each the C1 code and the C2 code is equal to 5. Therefore, correction of a 2-symbol error and extinction correction of a 4-symbol error (in the case where the positions of the erroneous symbols are known) can be performed.

32 symbols from the C1 encoder 44 are supplied to a 1-symbol delay circuit 45. The 1-symbol delay circuit 45 is provided to prevent a situation such that by separating the adjacent symbols, the 2-symbol error occurs due to errors existing over a boundary between the symbols. Although the Q parities have been inverted by an inverter, this is because even if all of the data and the parities become 0, the errors are enabled to be detected.

Figure 11:
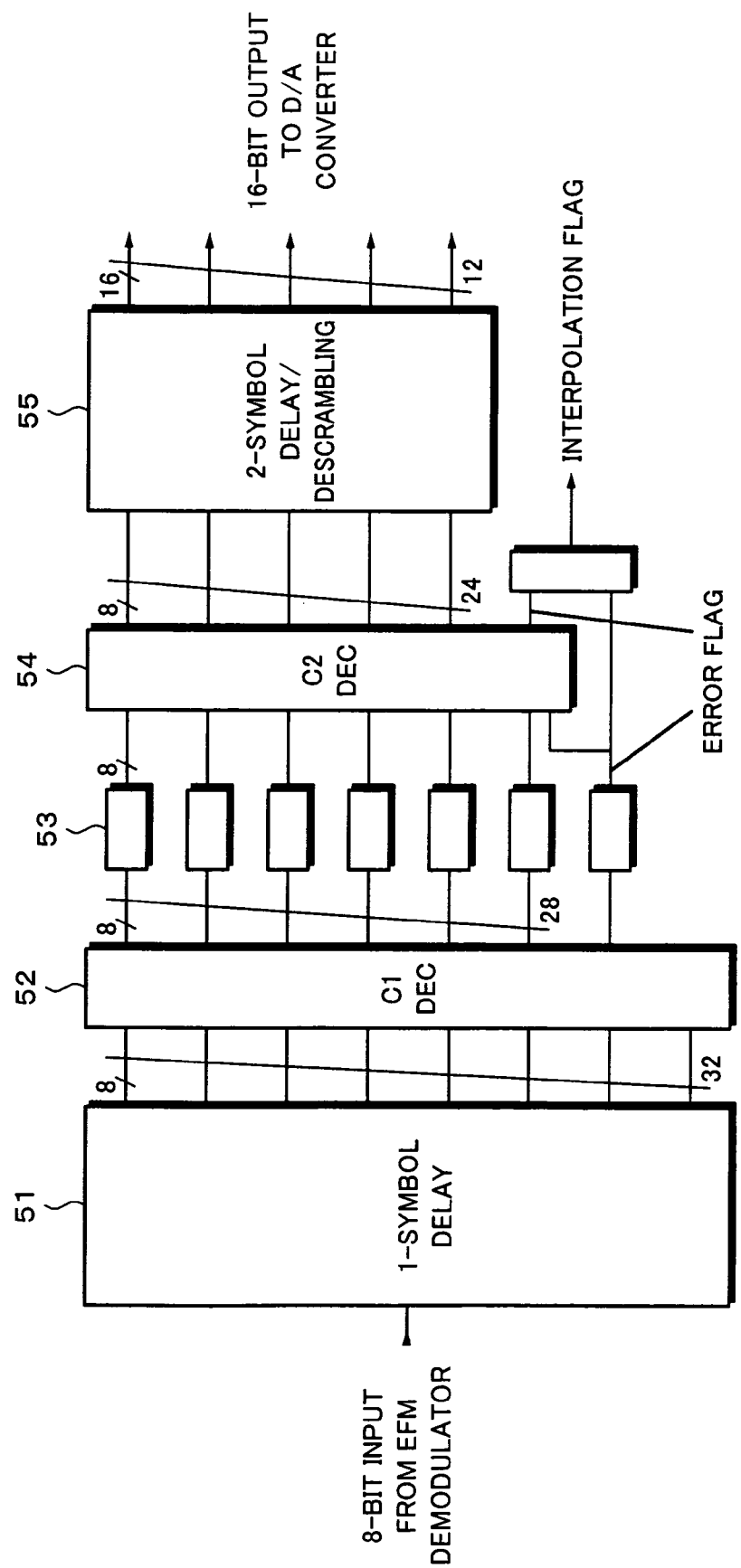
FIG. 11 is a block diagram showing an outline of an example of an error correction decoder which can be used in the invention.
Figure 12:
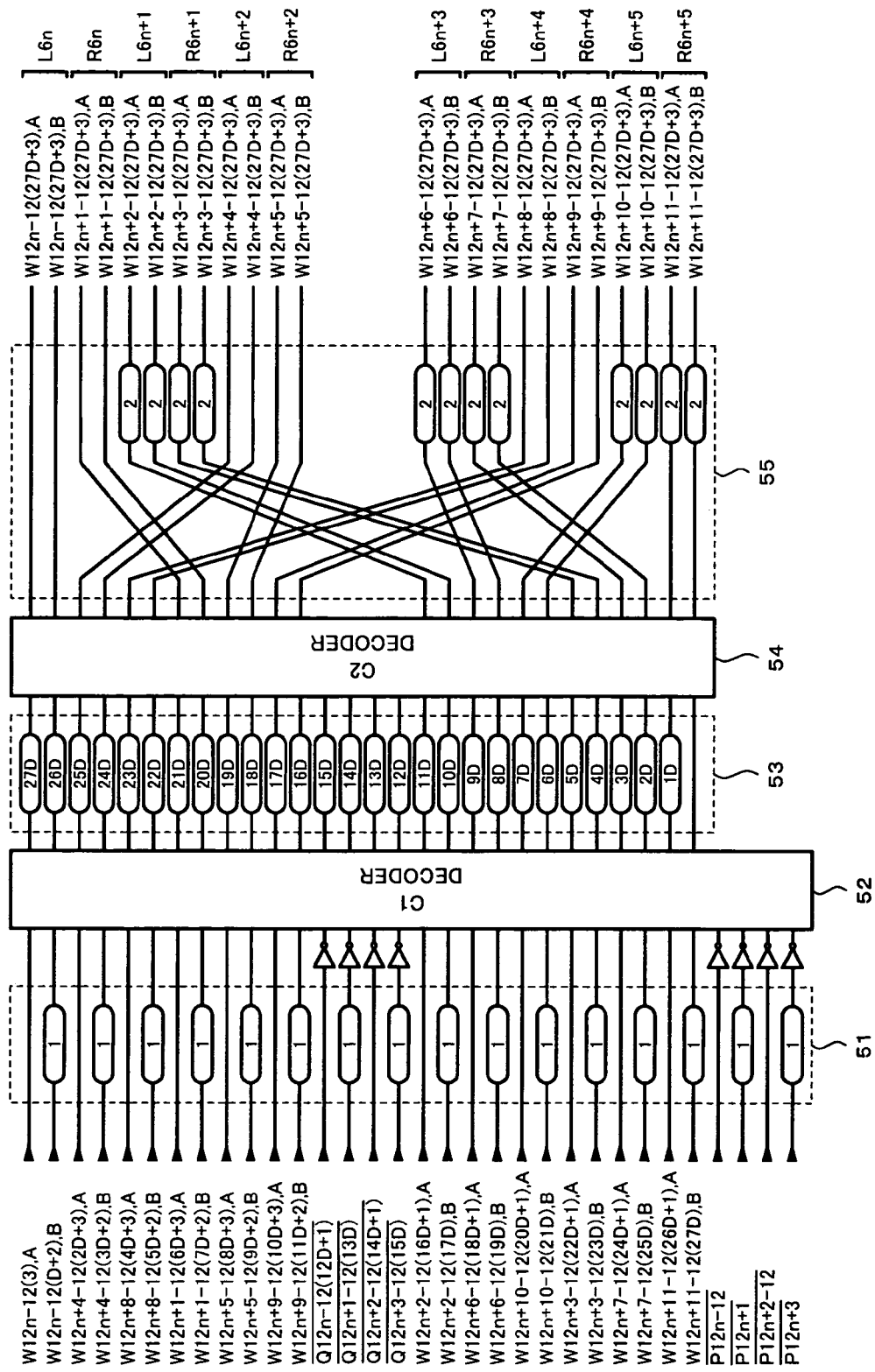
FIG. 12 is a block diagram showing in more detail an example of the error correction decoder which can be used in the invention.

An outline of a decoding of the CIRC is shown in FIG. 11 and its details are shown in FIG. 12. Constructions shown in FIGS. 11 and 12 correspond to the specific constructions of the decoders 18 and 22 of the reproducing apparatus shown in FIG. 3. FIGS. 11 and 12 are block diagrams shown along a decoding flow. A decoding process is executed in order opposite to that of the encoding process shown in FIGS. 9 and 10 mentioned above. First, reproduction data from an EFM demodulating circuit is supplied to a 1-symbol delay circuit 51. A delay given by the 1-symbol delay circuit 45 on the encoding side is cancelled in this circuit 51.

32 symbols from the 1-symbol delay circuit 51 are supplied to a C1 decoder 52. An output of the C1 decoder 52 is supplied to a deinterleaving circuit 53. The deinterleaving circuit 53 gives a delay amount which changes arithmetically to 27D, 26D, . . . , D, and 0 to 28 symbols so as to cancel the delay amount given by the interleaving circuit 43.

An output of the deinterleaving circuit 53 is supplied to a C2 decoder 54 and a decoding of a C2 code is executed. An output of 24 symbols of the C2 decoder 54 is supplied to a 2-symbol/descrambling circuit 55. Decoding data of 24 symbols is obtained from the circuit 55. In FIG. 11, although not shown, an error flag generated by the C1 decoder 52 is subjected to a deinterleaving process similar to that of the data symbols and transmitted to the C2 decoder 54. An interpolation flag is formed by an interpolation flag forming circuit 56 from the error flags from the C1 decoder 52 and the C2 decoder 54. The data indicative of the error is interpolated by the interpolation flag.

Figure 13:
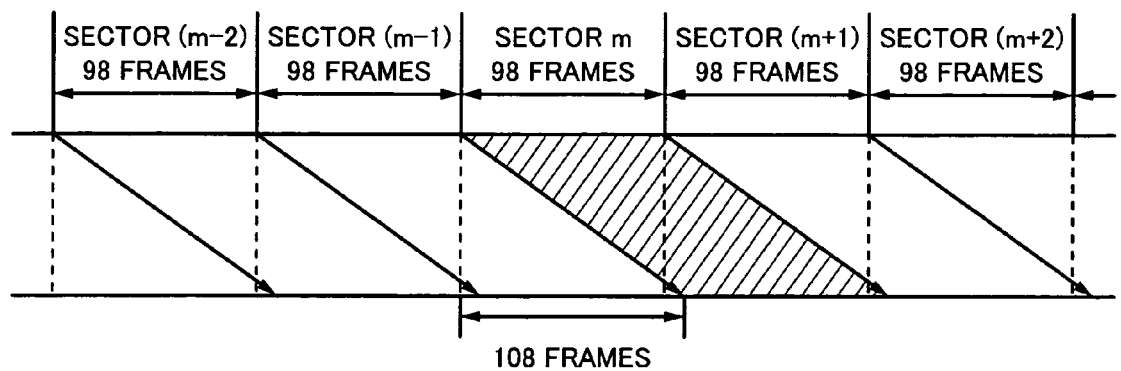
FIG. 13 is a schematic diagram for explaining interleave of an example of an error correction encoder based on an error correction code according to a system of CIRC4 which can be used in the invention.

As shown in FIG. 13, in the interleave by the error correction code by the CIRC4 system, the total interleave length is equal to 109 (=108+1) frames. Therefore, in FIG. 13, the data of a sector m is arranged as shown by hatched lines. If the data of the sector m is in the area shown by the hatched lines is rewritten, an influence is exerted on all C1 series of a sector (m+1 and a partial C1 series of a sector (m+2) and an influence is exerted on all C1 series of a sector (m−1) and a partial C1 series of a sector (m−2).

Therefore, in case of rewriting the data of the sector m, it is necessary to obtain the parities of the C1 series of the sectors (m+1), (m+2), (m−1), and (m−2) again in accordance with the rewritten data.

Upon reproduction, to decode the data of the sector m, not only all of the data of the sector m but also the partial data of the sector (m−2), all of the data of the sector (m−1), all of the data of the sector (m+1), and the partial data of the sector (m+2) are necessary. Since a minimum unit of the data which is reproduced is the sector, it is necessary to read out the data of five sectors.

Figure 14:
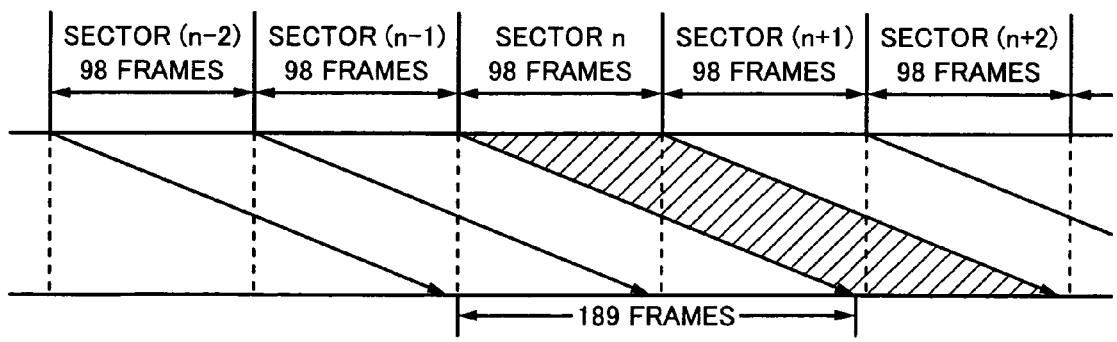
FIG. 14 is a schematic diagram for explaining interleave of an example of an error correction encoder based on an error correction code according to a system of CIRC7 which can be used in the invention.

FIG. 14 shows an example of the interleave of the error correction code based of the CIRC7 system. The example shown in FIG. 14 relates to a case where the interleave length is set to (D=7). In case of the interleaving circuit 43, a minimum delay amount is equal to "0", a maximum delay amount is equal to (27×7=189 frames), and a total interleave length is equal to 190 frames. This total interleave length is slightly smaller than a Value which is twice as large as the unit (98 frames) in which the subcode is completed.

According to the interleave shown in FIG. 14, in the case of rewriting one sector, for example, a sector n, it is necessary to obtain again C1 parities of the series of not only the sector n but also sectors (n−2), (n−1), (n+1), and (n+2). In the case of decoding data of the sector n, the sectors (n−2), (n−1), n, (n+1), and (n+2) are also similarly necessary. However, since all data of those accessed sectors is used, the accesses do not go to waste. Since the total interleave length is long to be 190 frames, there is an advantage such that powerful protection for the burst errors can be realized.

Further, although not shown, an interleaving process of setting D=14 or D=28 other than D=7 can be also performed. The total interleave length in this case is equal to (27×14+1=379<98×4) or (27×28+1=757<98×8), respectively. In both cases, the total interleave length is equal to a value which is slightly smaller than a value that is integer times as large as a period at which the subcode is completed.

As mentioned above, according to the interleave in which the total interleave length is set to the value which is almost integer times as large as 98 frames, in the case of integer times of 2 or more, there is an advantage such that the burst error correcting ability can be improved and such an interleave can be realized merely by changing the interleave length D.

Figure 15:
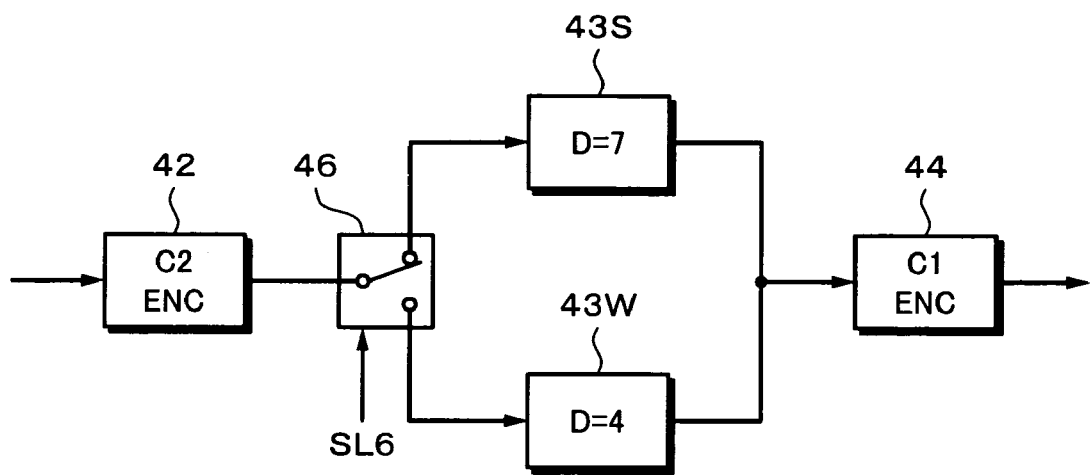
FIG. 15 is a block diagram of an example of an error correction encoder which can select an error correction encoding process based on the error correction code according to each system of CIRC4 and CIRC7 which can be used in the invention.

FIG. 15 shows an outline of a construction of an error correction encoder which can switch the error correction encoding process according to the CIRC4 system and the error correction encoding process according to the CIRC7 system. A selector 46 is provided after the C2 encoder 42. Either an interleaving circuit 43s of D=7 or an interleaving circuit 43w of D=4 is selected by the selector 46. The common C1 encoder 44 is connected to the interleaving circuits 43s and 43w. The selector 46 is controlled by a selection signal SL6. For example, the selector 46 is switched by the selection signal SL6 in a manner such that the data which is recorded in the first recording area PA1 on the disc 101 shown in FIGS. 7 and 8 is interleave processed by the interleaving circuit 43w and the data which is recorded in the second recording area PA2 is interleave processed by the interleaving circuit 43s.

Figure 16:
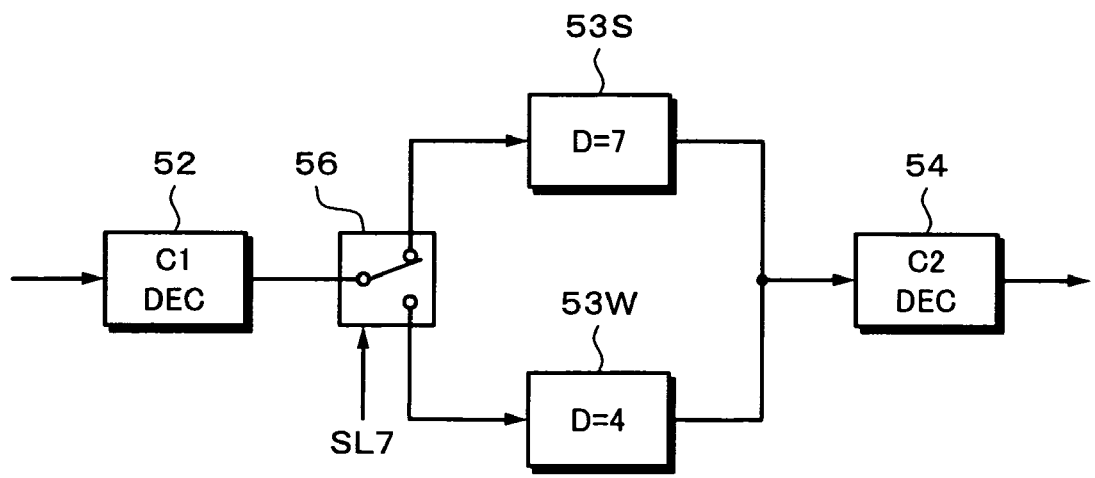
FIG. 16 is a block diagram of an example of an error correction decoder which can select an error correction process based on the error correction code according to each system of CIRC4 and CIRC7 which can be used in the invention.

FIG. 16 shows an outline of a construction of an error correction encoder which can switch the decoding process based on the error correction code according to the CIRC4 system and the decoding process based on the error correction code according to the CIRC7 system. A selector 56 is provided after the C1 encoder 52. Either a deinterleaving circuit 53s of D=7 or a deinterleaving circuit 53w of D=4 is selected by the selector 56. The common C2 decoder 54 is connected to the deinterleaving circuits 53s and 53w. The selector 56 is controlled by a selection signal SL7. For example, the selector 56 is switched by the selection signal SL7 in a manner such that the data read out from the first recording area PA1 on the disc 101 shown in FIGS. 7 and 8 is supplied to the deinterleaving circuit 53w and the data read out from the second recording area PA2 on the disc 101 is supplied to the deinterleaving circuit 53s. The selection signal SL7 is formed on the basis of the designation information for designating the error correction encoding method.

Actually, the interleaving circuits and the deinterleaving circuits are realized by using RAMs (Random Access Memories) and controlling their write addresses and read addresses in accordance with address tables. Therefore, in both of the encoders shown in FIG. 15 and the decoders shown in FIG. 16, the interleave length D can be switched by switching the address tables in the RAMs. Naturally, the encoders of the recording apparatus shown in FIG. 1 and the decoders shown in FIG. 3 can be also similarly constructed by using RAMs and switching address tables in the RAMs, for example, read addresses.

In the multisession disc having the first and second recording areas PA1 and PA2 on the disc shown in FIGS. 7 and 8, in a joint portion of the two recording areas (for example, a starting portion of the lead-in area LI2), symbols of a fixed value, for example, in which all bits are equal to "0" are continuously recorded as information data. Thus, parity symbols which are formed by the C2 encoder are set to the same value. Therefore, even if the joint portion processed as mentioned above is decoded by the decoder of either the error correction code by the CIRC4 system or the error correction code by the CIRC7 system, the same result is caused. In other words, by recording the fixed value into the joint portion of the two recording areas, a slight deviation of switching timings of the two error correction codes can be permitted. An area (mirror area) where no data is recorded can be also provided for the joint portion.

The invention is not limited to the embodiment of the invention mentioned above but various modifications and applications are possible within the purview of the invention without departing from the spirit thereof. For example, the method of making the error correcting ability different is not limited to the method of changing the interleave length but the distances of the codes can be also made different and the number of symbols which can be corrected can be also made different. Further, the error correction codes themselves can be also changed in accordance with a kind of data to be recorded.

The invention can be applied to the mastering apparatus for manufacturing the read only disc or the recording apparatus of the recordable medium, for example, the CD-R disc or CD-RW disc. For example, in the mastering apparatus for the CD-ROM disc on which the secure contents data has been recorded, the error correction code by the CIRC7 system is used. In the recording apparatus of the CD-R disc or CD-RW disc, the error correction code by the CIRC4 system is used. By this method, in the case where the secure contents data reproduced from the CD-ROM disc is copied by the recording apparatus of the CD-R disc or CD-RW disc, the encoding process based on the error correction code by the CIRC4 system is executed. Thus, differences among the CD-ROM disc, the CD-R disc, and the CD-RW disc become clear. In the recording apparatus of the CD-R disc or CD-RW disc on which the secure contents data has been recorded, however, the encoding process based on the error correction code by the CIRC7 system can be also executed.

According to the invention, the error correction encoding which is convenient for the data to be recorded can be executed. That is, the reliability of the secure contents can be improved to be higher than that of the non-secure contents. A value of charge contents or contents whose copy restriction is severe can be enhanced to be higher than that of other contents or the contents whose copy restriction is not severe. Second, the reliability of the data can be improved for the data which is difficult to be interleaved like compressed data. Third, the reliability of the data can be improved for the data (for example, data in the CD-ROM format) which is presumed to be-handled by the personal computer.

The two kinds of error correction codes are used in the data recording medium to which the invention is applied. Naturally, since the recording apparatus uses the same error correction code, it is difficult to construct the recording apparatus for making a copy of the medium to which the invention is applied and the illegal copy of the medium can be made difficult.

What is claimed is:

1. A recording method comprising the steps of:
   receiving supplied secure data;
   encrypting at least a part of said supplied secure data to produce encrypted data;
   receiving supplied non-secure data;
   operating a switching unit to output said encrypted data when fed thereto and to output said non-secure data when fed thereto;
   first executing an encoding process by using a first error correction code prior to recording encrypted data output from said switching unit;
   second executing an encoding process by using a second error correction code prior to recording said non-secure data output from said switching unit; and
   recording said encoded data from said first and second executing steps onto a recording medium.

2. The recording method according to claim 1, wherein an error correcting ability by said first error correction code is higher than an error correcting ability by said second error correction code.

3. The recording method according to claim 2, wherein said first error correction code and said second error correction code are Reed Solomon codes.

4. The recording method according to claim 3, wherein an interleave length of said first error correction code is longer than an interleave length of said second error correction code.

5. The recording method of a recording medium according to claim 4, wherein said first error correction code and said second error correction code are cross-interleaved Reed Solomon codes, the interleave length of said first error correction code is 7, and the interleave length of said second error correction code is 4.

6. The recording method according to claim 1, wherein designation data for identifying that the data has been encoded by either said first error correction code or said second error correction code is recorded onto said recording medium.

7. A recording method comprising the steps of:
   first discriminating whether supplied data is data in which at least a part of said data has been encrypted;
   operating a switching unit to output the data at least a part of which has been encrypted that is discriminated in said first discriminating step;
   executing an encoding process by a first error correction code when said supplied data is encrypted data output from said switching unit;
   second discriminating whether said supplied data is non-encrypted data;
   operating the switching unit to output the non-encrypted data that is discriminated in said second discriminating step;
   when encryption is performed, executing an encrypting process to said supplied data and, thereafter, executing the encoding process by using said first error correction code;
   when encryption is not performed, executing the encoding process by using a second error correction code; and
   recording said encoded data onto a recording medium.

8. The recording method according to claim 7, wherein an error correcting ability by said first error correction code is higher than an error correcting ability by said second error correction code.

9. The recording method according to claim 8, wherein said first error correction code and said second error correction code are Reed Solomon codes.

10. The recording method according to claim 9, wherein an interleave length of said first error correction code is longer than an interleave length of said second error correction code.

11. The recording method according to claim 10, wherein said first error correction code and said second error correction code are cross-interleaved Reed Solomon codes, the interleave length of said first error correction code is 7, and the interleave length of said second error correction code is 4.

12. The recording method according to claim 7, wherein designation data for identifying that the data has been encoded by either said first error correction code or said second error correction code is recorded onto said recording medium.

13. A recording apparatus comprising:
   an encrypting circuit for encrypting supplied secure data and outputting encrypted data;
   a selecting unit for selecting for output either the encrypted data or supplied non-secure data;
   a first encoder for performing an error correction encoding process based on a first error correction code to said encrypted data output from said selecting unit;
   a second encoder for performing an error correction encoding process based on a second error correction code to said supplied non-secure data output from said selecting unit; and
   recording means to which output data from said first encoder and output data from said second encoder are supplied and which performs a modulating process to the output data from said first or second encoder and records the modulated data onto a recording medium.

14. The recording apparatus of according to claim 13, wherein an error correcting ability by said first error correction code that is used in said first encoder is higher than an error correcting ability by said second error correction code that is used in said second encoder.

15. The recording apparatus according to claim 14, wherein said first error correction code that is used in said first encoder and said second error correction code that is used in said second encoder are Reed Solomon codes.

16. The recording apparatus according to claim 13, wherein an interleave length of said first error correction code is longer than an interleave length of said second error correction code.

17. The recording apparatus according to claim 16, wherein said first error correction code and said second error correction code are cross-interleaved Reed Solomon codes, the interleave length of said first error correction code is 7, and the interleave length of said second error correction code is 4.

18. The recording apparatus according to claim 13, wherein said recording means records designation data for identifying by which either said first error correction code or said second error correction code the data has been encoded onto said recording medium.

* * * * *